United States Patent
Wu et al.

(10) Patent No.: US 11,164,947 B2
(45) Date of Patent: Nov. 2, 2021

(54) WRAP AROUND CONTACT FORMATION FOR VTFET

(71) Applicant: International Business Machines Corporation, Armonk, NY (US)

(72) Inventors: Heng Wu, Guilderland, NY (US); Ruilong Xie, Niskayuna, NY (US); Shogo Mochizuki, Clifton Park, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/805,744

(22) Filed: Feb. 29, 2020

(65) Prior Publication Data
US 2021/0273063 A1 Sep. 2, 2021

(51) Int. Cl.
*H01L 29/66* (2006.01)
*H01L 27/092* (2006.01)
*H01L 29/417* (2006.01)
*H01L 29/08* (2006.01)
*H01L 29/10* (2006.01)
*H01L 29/78* (2006.01)
*H01L 29/45* (2006.01)
*H01L 21/8238* (2006.01)
*H01L 21/311* (2006.01)

(52) U.S. Cl.
CPC .. *H01L 29/41741* (2013.01); *H01L 21/31111* (2013.01); *H01L 21/823814* (2013.01); *H01L 21/823885* (2013.01); *H01L 27/092* (2013.01); *H01L 29/0847* (2013.01); *H01L 29/1037* (2013.01); *H01L 29/45* (2013.01); *H01L 29/6656* (2013.01); *H01L 29/66666* (2013.01); *H01L 29/7827* (2013.01)

(58) Field of Classification Search
CPC ..... H01L 21/823885; H01L 21/823814; H01L 21/823487; H01L 27/092; H01L 29/66666; H01L 29/7827; H01L 29/0847; H01L 29/41741; H01L 29/45; H01L 21/823418
See application file for complete search history.

(56) References Cited

U.S. PATENT DOCUMENTS

| | | | |
|---|---|---|---|
| 9,425,310 B2 | 8/2016 | Yang | |
| 9,443,769 B2 | 9/2016 | Wang et al. | |
| 9,735,253 B1 | 8/2017 | Bi et al. | |

(Continued)

*Primary Examiner* — Michael M Trinh
(74) *Attorney, Agent, or Firm* — Jeffrey S. LaBaw; Michael J. Chang, LLC

(57) ABSTRACT

Improved top source and drain contact designs for VTFET devices are provided. In one aspect, a method of forming a VTFET device includes: depositing a first ILD over a VTFET structure having fins patterned in a substrate, bottom source and drains at a base of the fins, bottom spacers on the bottom source and drains and gates alongside the fins; patterning trenches in the first ILD; forming top spacers lining the trenches; forming top source and drains in the trenches at the tops of the fins; forming sacrificial caps covering the top source and drains; depositing a second ILD onto the first ILD; patterning contact trenches in the second ILD, exposing the sacrificial caps; removing the sacrificial caps through the contact trenches; and forming top source and drain contacts in the contact trenches that wrap around the top source and drains. A VTFET device is also provided.

18 Claims, 19 Drawing Sheets

(56) References Cited

U.S. PATENT DOCUMENTS

| | | | |
|---|---|---|---|
| 9,773,708 B1* | 9/2017 | Zhang | H01L 29/66545 |
| 9,997,418 B2 | 6/2018 | Pranatharthiharan et al. | |
| 10,109,535 B2 | 10/2018 | Mallela et al. | |
| 10,283,621 B2* | 5/2019 | Xie | H01L 29/66666 |
| 10,559,671 B2* | 2/2020 | Jagannathan | H01L 29/4991 |
| 10,923,590 B2* | 2/2021 | Cheng | H01L 21/823468 |
| 10,944,003 B2* | 3/2021 | You | H01L 23/5329 |
| 2006/0163670 A1 | 7/2006 | Ellis-Monaghan et al. | |
| 2014/0210011 A1 | 7/2014 | Baraskar et al. | |
| 2018/0005896 A1 | 1/2018 | Mallela et al. | |
| 2018/0090582 A1 | 3/2018 | Adusumilli et al. | |
| 2019/0172927 A1* | 6/2019 | Jagannathan | H01L 29/6653 |
| 2020/0075737 A1* | 3/2020 | Lee | H01L 29/0847 |
| 2020/0303543 A1* | 9/2020 | Cheng | H01L 21/76834 |
| 2020/0357898 A1* | 11/2020 | Lee | H01L 27/088 |

* cited by examiner

WRAP AROUND CONTACT FORMATION FOR VTFET

FIELD OF THE INVENTION

The present invention relates to vertical transport field-effect transistor (VTFET) devices, and more particularly, to improved top source and drain contact designs for VTFET devices having a wrap-around contact providing an enlarged contact area.

BACKGROUND OF THE INVENTION

As opposed to planar complementary metal-oxide-semiconductor (CMOS) devices, vertical transport field-effect transistor (VTFET) devices are oriented with a vertical fin channel disposed on a bottom source and drain and a top source and drain disposed on the fin channel. VTFET devices have been pursued as a potential device option for scaling CMOS to the 5 nanometer (nm) node and beyond.

Implementation of a VTFET device architecture, however, presents some notable challenges. For instance, with current VTFET fabrication processes formation of the top source and drain contacts involves a contact trench etch landing on the top source and drains. Oftentimes this etch undesirably leads to a large amount of erosion of the top source and drain epitaxial material. Further, the contact area to the top source and drains is often small, leading to an increased resistance.

Therefore, improved techniques for forming top source and drain contacts for VTFET devices that maximize contact area and thus reduce resistance would be desirable.

SUMMARY OF THE INVENTION

The present invention provides improved top source and drain contact designs for vertical transport field-effect transistor (VTFET) devices having a wrap-around contact providing an enlarged contact area. In one aspect of the invention, a method of forming a VTFET device is provided. The method includes: depositing a first interlayer dielectric (ILD) over a VTFET structure having fins patterned in a substrate, bottom source and drains formed at a base of the fins, bottom spacers formed on the bottom source and drains and gates formed alongside the fins above the bottom spacers; patterning trenches in the first ILD that expose the tops of the fins; forming top spacers conformally lining the trenches; forming top source and drains in the trenches at the tops of the fins, wherein the top source and drains are non-merged with one another; forming sacrificial caps covering the top source and drains; depositing a second ILD onto the first ILD over the top source and drains and the sacrificial caps; patterning contact trenches in the second ILD over the top source and drains, exposing the sacrificial caps, wherein the sacrificial caps protect the top source and drains during the patterning of the contact trenches; removing the sacrificial caps through the contact trenches; and forming top source and drain contacts in the contact trenches that wrap around the top source and drains.

In another aspect of the invention, another method of forming a VTFET device is provided. The method includes: depositing a first ILD over a VTFET structure having first fins and second fins patterned in a substrate, bottom source and drains formed at a base of the first fins and the second fins, bottom spacers formed on the bottom source and drains and gates formed alongside the first fins and the second fins above the bottom spacers; patterning trenches in the first ILD that expose the tops of the first fins and the second fins; forming top spacers conformally lining the trenches; masking the trenches over the second fins; selectively forming first top source and drains in the trenches at the tops of the first fins, wherein the first top source and drains are non-merged with one another; masking the first top source and drains in the trenches at the tops of the first fins; selectively forming second top source and drains in the trenches at the tops of the second fins, wherein the second top source and drains are non-merged with one another; forming sacrificial caps covering the first top source and drains and the second top source and drains; depositing a second ILD onto the first ILD over the first top source and drains, the second top source and drains and the sacrificial caps; patterning contact trenches in the second ILD over the first top source and drains and the second top source and drains, exposing the sacrificial caps, wherein the sacrificial caps protect the first top source and drains and the second top source and drains during the patterning of the contact trenches; removing the sacrificial caps through the contact trenches; and forming top source and drain contacts in the contact trenches that wrap around the first top source and drains and the second top source and drains.

In yet another aspect of the invention, a VTFET device is provided. The VTFET device includes: fins patterned in a substrate; bottom source and drains at a base of the fins; bottom spacers disposed on the bottom source and drains; gates alongside the fins above the bottom spacers; a first ILD surrounding the fins and the gates; trenches patterned in the first ILD at tops of the fins; top spacers conformally lining the trenches; top source and drains formed in the trenches at the tops of the fins, wherein the top source and drains are non-merged with one another, and wherein the top source and drains each have a diamond-shaped design having downward sloping facets to either side of a central peak; a second ILD disposed on the first ILD over the top source and drains; contact trenches patterned in the second ILD over the top source and drains; and top source and drain contacts formed in the contact trenches that wrap around the top source and drains.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for reducing epitaxy erosion during the top source and drain contact landing in vertical transport field-effect transistor (VTFET) device fabrication. Advantageously, the present techniques can be applied to large or small top source and drains and provide enlarged contact area using a wrap-around design with minimal erosion of the top source and drain epitaxial material during contact formation.

An exemplary methodology for forming a VTFET device in accordance with the present techniques is now described by way of reference to FIGS. 1-19. In the process flow that follows, multiple p-channel VTFET (PFET) and n-channel (NFET) devices are formed. However, it is to be understood that the present techniques are more broadly applicable to the fabrication of any type VTFET device design including those having devices of only one polarity (PFET or NFET), designs having only a single PFET and/or a single NFET device, etc.

Figure 1:
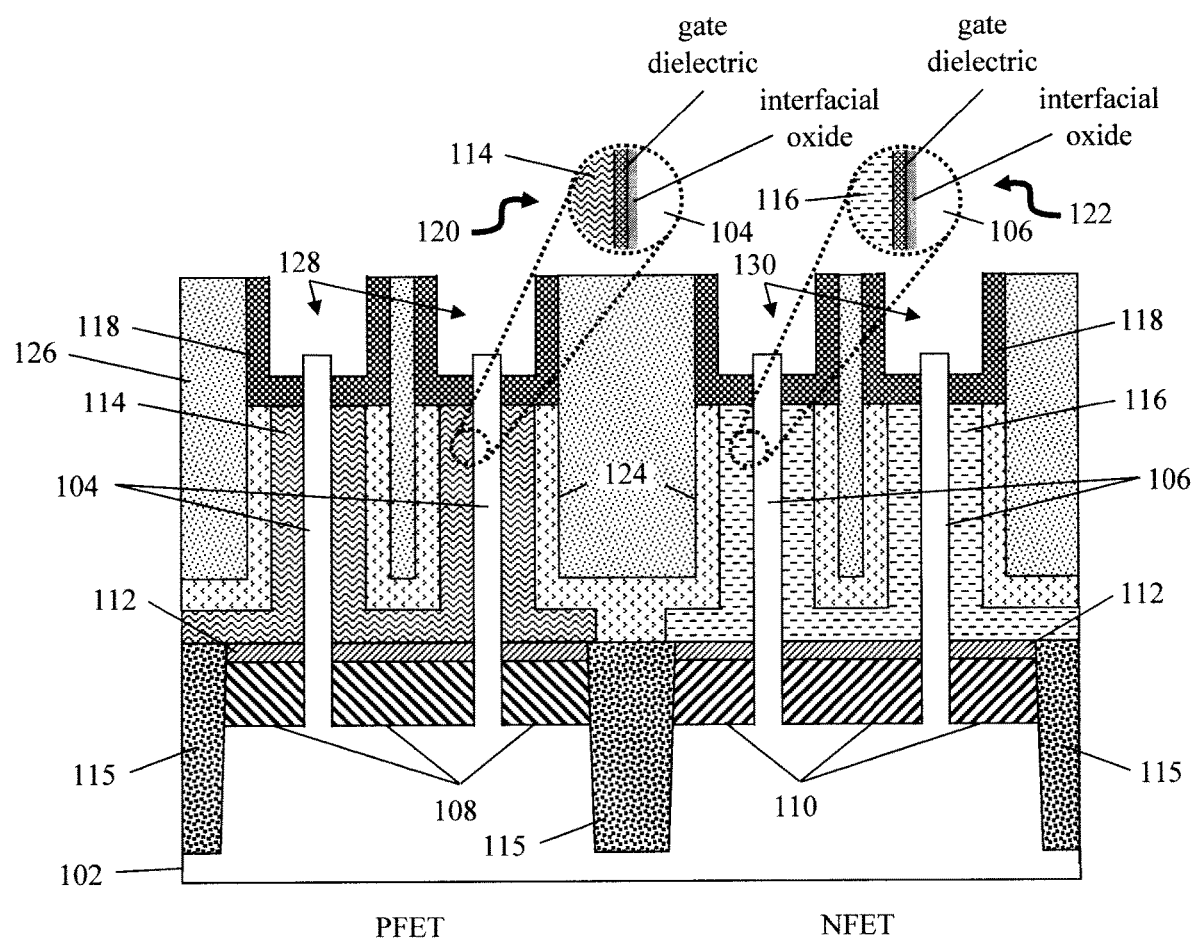
FIG. 1 is a cross-sectional diagram illustrating a vertical transport field-effect transistor (VTFET) structure having been formed that has (first) p-channel FET (PFET) and (second) re-channel FET (NFET) fins patterned in a substrate, bottom source and drains formed at a base of the PFET/NFET fins, bottom spacers formed on the bottom source and drains and gates formed alongside the PFET/NFET fins above the bottom spacers, a first interlayer dielectric (ILD) having been deposited over the VTFET structure, (first/second) trenches having been patterned in the first ILD that expose the tops of the PFET/NFET fins, and top spacers having been formed conformally lining the first/second trenches according to an embodiment of the present invention.
Figure 2:
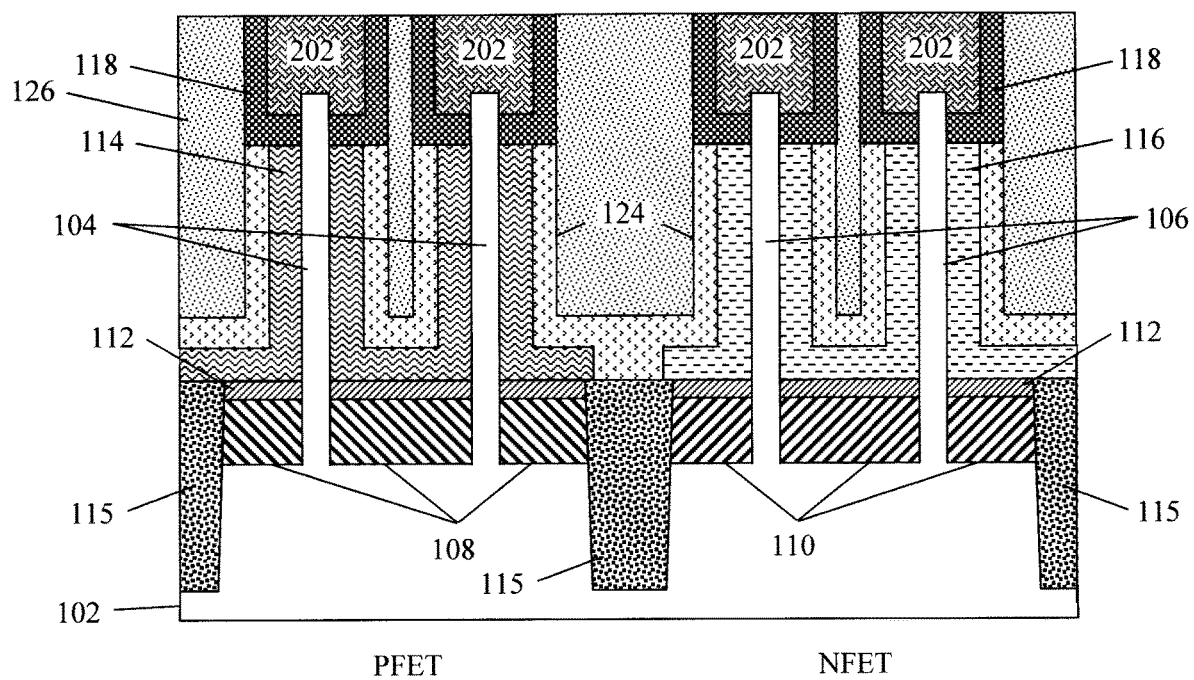
FIG. 2 is a cross-sectional diagram illustrating the first/second trenches having been filled with a sacrificial material according to an embodiment of the present invention.

As shown in FIG. 1, the process begins with the formation of a VTFET structure having at least one PFET fin 104 and at least one NFET fin 106 patterned in a substrate 102. The PFET fin(s) 104 and NFET fin(s) 106 may also be referred to herein as 'first fins' and 'second fins' respectively. Bottom source and drains 108 and 110 are formed at the base of the PFET and NFET fins 104 and 106, respectively, and bottom spacers 112 are formed on the bottom source and drains 108 and 110. Gates are formed above the bottom spacers 112 alongside the PFET and NFET fins 104 and 106 containing at least one first workfunction-setting metal 114 and at least one second workfunction-setting metal 116, respectively. Top spacers 118 are formed over the gates.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Standard lithography and etching processes can be employed to pattern the PFET and NFET fins 104 and 106 in substrate 102, with a directional (anisotropic) etching process such as reactive ion etching (RIE) for the fin etch. Alternatively, the PFET and NFET fins 104 and 106 can be formed in substrate 102 by other suitable techniques, including but not limited to, sidewall image transfer (SIT), self-aligned double patterning (SADP), self-aligned quadruple patterning (SAQP), and other self-aligned multiple patterning (SAMP).

As shown in FIG. 1, shallow trench isolation (STI) regions 115 are formed in substrate 102 to isolate the PFET fin(s) 104 from the NFET fin(s) 106. To form the STI regions 115, trenches are first patterned in the substrate 102 in between the PFET fin(s) 104 and the NFET fin(s) 106. The trenches are then filled with an insulator material, e.g., an oxide material (also referred to herein as an "STI oxide") such as silicon oxide (SiOx) to form the STI regions 115. Although not explicitly shown in the figures, a liner (e.g., a thermal oxide or silicon nitride (SiN)) may be deposited into the trenches prior to the STI oxide.

According to an exemplary embodiment, bottom source and drains 108 and 110 are formed from an in-situ doped (i.e., during growth) or ex-situ doped (e.g., via ion implantation) epitaxial material such as epitaxial Si, epitaxial Ge and/or epitaxial SiGe. Suitable n-type dopants include, but are not limited to, phosphorous (P) and/or arsenic (As). Suitable p-type dopants include, but are not limited to, boron (B). For instance, by way of example only, in one non-limiting exemplary embodiment, bottom source and drains 108 at the base of the PFET fin(s) 104 are formed from boron-doped epitaxial SiGe (SiGe:B) and bottom source and drains 110 at the base of the NFET fin(s) 106 are formed from phosphorous-doped epitaxial Si (Si:P).

Suitable materials for the bottom spacers 112 include, but are not limited to, oxide spacer materials such as SiOx and/or silicon oxycarbide (SiOC) and/or nitride spacer materials such as SiN and/or silicon-boron-nitride (SiBN). According to an exemplary embodiment, the bottom spacers 112 are formed using a directional deposition process whereby a greater amount of the spacer material is deposited on horizontal surfaces including on top of bottom source and drains 108 and 110 in between the PFET and NFET fins 104 and 106, as compared to vertical surfaces. A timed etch is then used to remove the spacer material deposited onto the vertical surfaces, leaving the bottom spacers 112 shown in FIG. 1 on the bottom source and drains 108 and 110 since a greater amount of the spacer material was deposited on the bottom source and drains 108 and 110 to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces. According to an exemplary embodiment, bottom spacers 112 have a thickness of from about 1 nm to about 5 nm and ranges therebetween.

As highlighted above, the gates are formed alongside the PFET and NFET fins 104 and 106 contain at least one first workfunction-setting metal 114 and at least one second workfunction-setting metal 116, respectively. According to an exemplary embodiment, the at least one first workfunction-setting metal 114 is a p-type workfunction-setting metal, and the at least one second workfunction-setting metal 116 is an n-type workfunction-setting metal. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

As shown in magnified view 120, according to an exemplary embodiment the gates along the PFET fins 104 include an interfacial oxide formed on the PFET fins 104, a conformal gate dielectric disposed on the PFET fins 104 over the interfacial oxide, and the (conformal) first workfunction-setting metal(s) 114 disposed on the gate dielectric. In one exemplary embodiment, the interfacial oxide is SiOx (which may include other chemical elements in it such as nitrogen, germanium, etc.) that is formed selectively on exposed surfaces of the PFET and NFET fins 104 and 106 by an oxidation process to a thickness of from about 0.3 nanometers (nm) to about 5 nm, and ranges therebetween, e.g., about 1 nm.

In an exemplary embodiment, the gate dielectric is a high-κ gate dielectric. The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as chemical vapor deposition (CVD), atomic layer deposition (ALD) or physical vapor deposition (PVD) can be used to deposit the gate dielectric. According to an exemplary embodiment, the gate dielectric has a thickness of from about 2 nm to about 5 nm and ranges therebetween.

A process such as CVD, ALD, PVD, evaporation or sputtering can be used to deposit the at least one first workfunction-setting metal 114 onto the gate dielectric. According to an exemplary embodiment, the at least one first workfunction-setting metal 114 has a thickness of from about 10 nm to about 20 nm and ranges therebetween.

Similarly, as shown in magnified view 122, according to an exemplary embodiment the gates along the NFET fins 106 include an interfacial oxide formed on the NFET fins 106, a conformal gate dielectric disposed on the NFET fins 106 over the interfacial oxide, and the (conformal) second workfunction-setting metal(s) 116 disposed on the gate dielectric. As above, in an exemplary embodiment, the gate dielectric is a high-κ gate dielectric such as $HfO_2$ and/or La$_2$O$_3$ deposited to a thickness of from about 2 nm to about 5 nm and ranges therebetween using a process such as CVD, ALD or PVD.

A process such as CVD, ALD, PVD, evaporation or sputtering can be used to deposit the at least one second workfunction-setting metal 116 onto the gate dielectric. According to an exemplary embodiment, the at least one second workfunction-setting metal 116 has a thickness of from about 10 nm to about 20 nm and ranges therebetween.

As shown in FIG. 1, a conformal capping layer 124 is disposed over the first and second workfunction-setting metals 114 and 116. Suitable materials for capping layer 124 include, but are not limited to, SiN, silicon boron carbon nitride (SiBCN), silicon oxycarbon nitride (SiOCN), and/or silicon carbon nitride (SiCN). A process such as CVD or ALD can be employed to deposit the capping layer 124. According to an exemplary embodiment, capping layer 124 has a thickness of from about 5 nm to about 10 nm and ranges therebetween. As further shown in FIG. 1, the capping layer 124 and the first and second workfunction-setting metals 114 and 116 are recessed to expose the tops of the PFET and NFET fins 104 and 106, respectively. This will enable the formation of top source and drains at the tops of the PFET and NFET fins 104 and 106 (see below).

A (first) interlayer dielectric (ILD) 126 is deposited over the VTFET structure surrounding the PFET and NFET fins 104 and 106 and the gates. Suitable materials for the ILD 126 include, but are not limited to, oxide low-κ materials such as SiOx and/or oxide ultralow-κ interlayer dielectric (ULK-ILD) materials, e.g., having a dielectric constant K of less than 2.7. By comparison, silicon dioxide (SiO$_2$) has a dielectric constant κ value of 3.9. Suitable ultralow-K dielectric materials include, but are not limited to, porous organosilicate glass (pSiCOH). A process such as CVD, ALD or PVD can be employed to deposit ILD 126 around the PFET and NFET fins 104 and 106 and the gates.

As shown in FIG. 1, (first/second) trenches 128 and 130 are patterned in the ILD 126 exposing the tops of the PFET and NFET fins 104 and 106, respectively. The top spacers 118 conformally line the trenches 128 and 130. Suitable materials for the top spacers 118 include, but are not limited to, oxide spacer materials such as SiOx and/or SiOC and/or nitride spacer materials such as SiN and/or SiBN. A process such as CVD, ALD or PVD can be employed to deposit the top spacers 118 into the trenches 128 and 130. According to an exemplary embodiment, top spacers 118 have a thickness of from about 5 nm to about 10 nm and ranges therebetween.

In accordance with the present techniques, top source and drains will be formed in the trenches 128 and 130 over the top spacers 118 at the tops of the PFET and NFET fins 104 and 106. As will be described in detail below, a non-merged epitaxial material forms the top source and drain individually over each of the PFET and NFET fins 104 and 106. By "non-merged" it is meant that the top source and drain formed over a given one of the PFET or NFET fins 104 and 106 does not contact the top source and drain formed over the adjacent fin(s). By comparison, in conventional VTFET fabrication processes the epitaxial top source and drains grown at the tops of the fins typically merge into a common material over the fins.

The trenches 128 and 130 are next filled with a sacrificial material 202. See FIG. 2. The term "sacrificial" as used herein refers to the placement of a material(s) at one point in the process, which is/are subsequently removed (in whole or in part) at another, later point in the process. For instance, as will be described in detail below, sacrificial material 202 will be selectively removed from the PFET fins 104 enabling the formation of the top source and drains at the tops of the PFET fins 104 while the sacrificial material 202 and a liner (see below) masks the tops of the NFET fins 106. The sacrificial material 202 is then removed from the NFET fins 106 enabling the formation of the top source and drains at the tops of the NFET fins 106 while sacrificial caps and liner (see below) protect the top source and drains of the PFET fins 104. Notably, the order in which the PFET and NFET fins 104 and 106 are processed is arbitrary, and formation of the top source and drains at the tops of the NFET fins 106 can instead be performed first, followed by the PFET fins 104.

Suitable sacrificial materials 202 include, but are not limited to, poly-silicon (poly-Si) and/or amorphous silicon (a-Si). A process such as CVD, ALD or PVD can be employed to deposit the sacrificial material 202 into trenches 128 and 130. Following deposition, the sacrificial material 202 can be planarized using a process such as chemical-mechanical polishing (CMP).

The sacrificial material 202 is then removed from one of trenches 128 and 130 selective to the other to enable formation of the top source and drains. For instance, in this particular example, sacrificial material 202 is first selectively removed from trenches 128 over PFET fins 104 (i.e., sacrificial material 202 remains in trenches 130). However, this choice to process the PFET fins 104 first is arbitrary, and the sacrificial material 202 could instead have been removed from trenches 130 first.

To enable selective removal of the sacrificial material 202 from (in this case) trenches 128, a (first) liner 302 is formed over/masking the sacrificial material 202 in trenches 130. See FIG. 3. To do so, a liner material is blanket deposited over both trenches 128 and 130, and then patterned into the liner 302 shown in FIG. 3 covering the sacrificial material 202 in trenches 130. Suitable materials for the liner 302 include, but are not limited to, SiN, SiBCN, SiOCN, and/or SiCN. A process such as CVD, ALD or PVD can be employed to deposit the liner 302. A standard lithography and etching process can be employed to pattern the liner material. With standard lithography and etching processes, a lithographic stack (not shown), e.g., photoresist/organic planarizing layer (OPL)/anti-reflective coating (ARC), is used to pattern a hardmask (not shown). The pattern from the hardmask is then transferred to the underlying layer. The hardmask is then removed. A directional (anisotropic) etching process such as reactive ion etching (RIE) can be employed for patterning the liner material. According to an exemplary embodiment, liner 302 has a thickness of from about 5 nm to about 10 nm and ranges therebetween.

Figure 3:
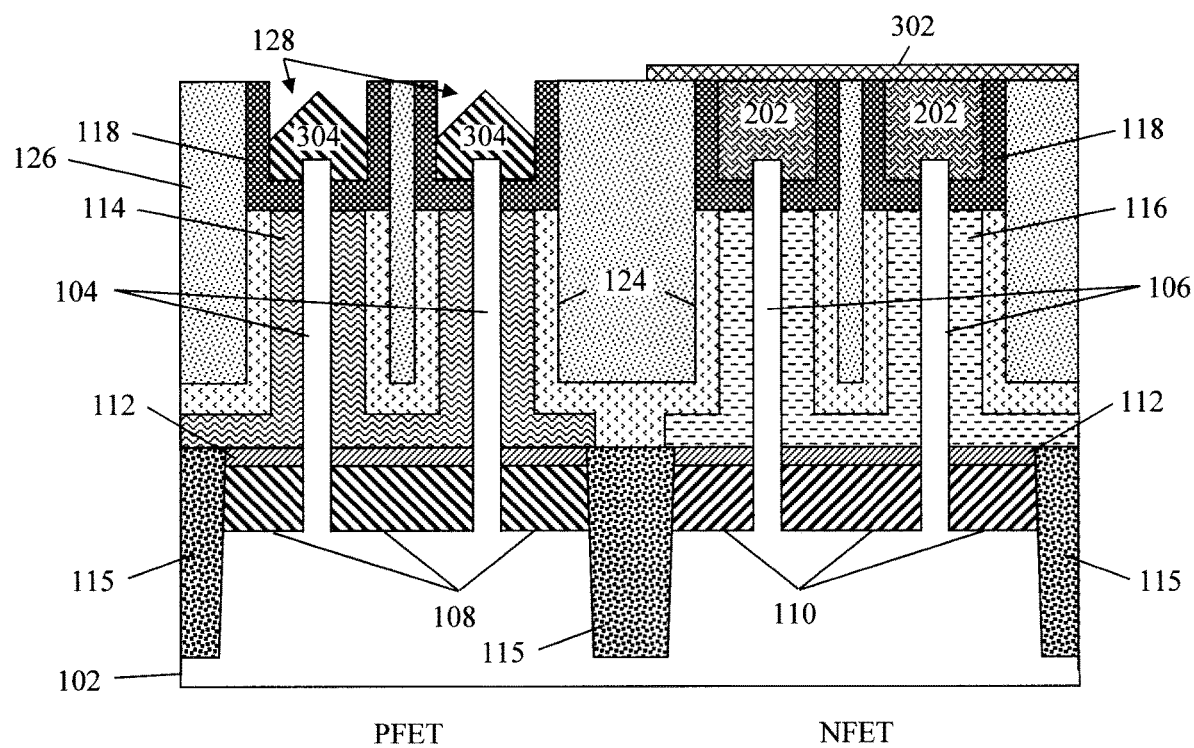
FIG. 3 is a cross-sectional diagram illustrating a (first) liner having been formed over/masking the sacrificial material in the second trenches, the sacrificial material having been removed from first trenches, and (first) top source and drains having been formed in the first trenches at the tops of the PFET fins according to an embodiment of the present invention.
Figure 4:
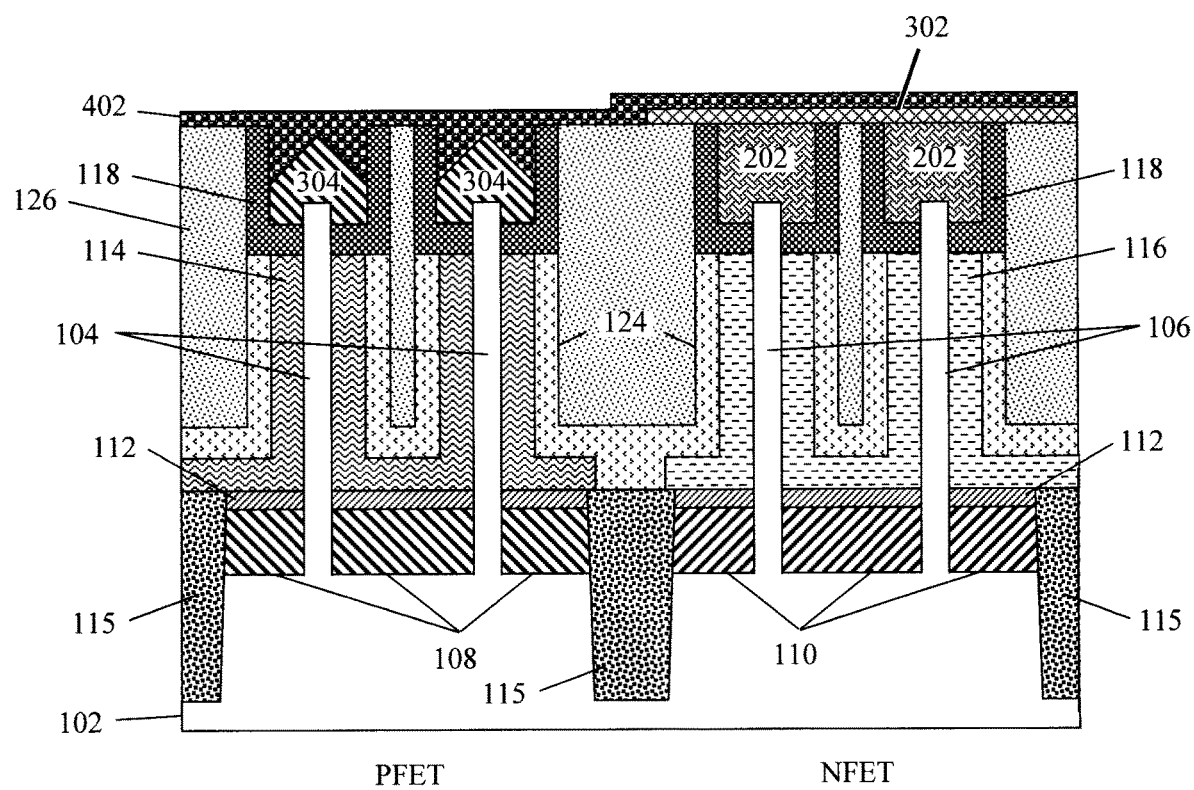
FIG. 4 is a cross-sectional diagram illustrating a (first) sacrificial capping material having been deposited into the first trenches over the first top source and drains and onto the first liner (covering the sacrificial material over the NFET fins) according to an embodiment of the present invention.

With liner 302 present over and covering the sacrificial material 202 in trenches 130, the sacrificial material 202 is removed from trenches 128. According to an exemplary embodiment, the sacrificial material 202 is removed from trenches 128 using a non-directional (i.e., isotropic) etching process such as a wet chemical etch. Doing so reopens the trenches 128 and, as shown in FIG. 3, (first) top source and drains 304 are formed in trenches 128 at the tops of PFET fins 104, while liner 302 and sacrificial material 202 in trenches 130 mask the tops of NFET fins 106.

According to an exemplary embodiment, top source and drains 304 are formed from a p-type in-situ doped (i.e., during growth) or ex-situ doped (e.g., via ion implantation) epitaxial material such as epitaxial Si, epitaxial Ge and/or epitaxial SiGe. As provided above, suitable p-type dopants include, but are not limited to, boron (B). For instance, by way of example only, in one non-limiting exemplary embodiment, top source and drains 304 are formed from SiGe:B. As shown in FIG. 3, the top source and drains 304 formed at the at the tops of fins 104 are contained within trenches 128, i.e., the top source and drains 304 formed at the at the tops of fins 104 are non-merged. Also as shown in FIG. 3, the top source and drains 304 formed at the at the tops of fins 104 have a diamond-shaped design. Namely, the top surface of top source and drains 304 have downward sloping facets to either side of a central peak. This diamond-shaped design will advantageously increase the contact area.

The next task is to form (first) sacrificial caps over/covering the top source and drains 304, and then repeating the process with the opposite fins (in this case NFET fins 106). To do so, a (first) sacrificial capping material 402 is first blanket deposited into trenches 128 over top source and drains 304 and onto liner 302 (covering sacrificial material 202 over NFET fins 106). See FIG. 4. Suitable sacrificial capping materials include, but are not limited to, germanium dioxide ($GeO_2$), titanium dioxide ($TiO_2$) and/or titanium nitride (TiN). A process such as CVD, ALD or PVD can be employed to deposit the sacrificial capping material 402.

Figure 5:
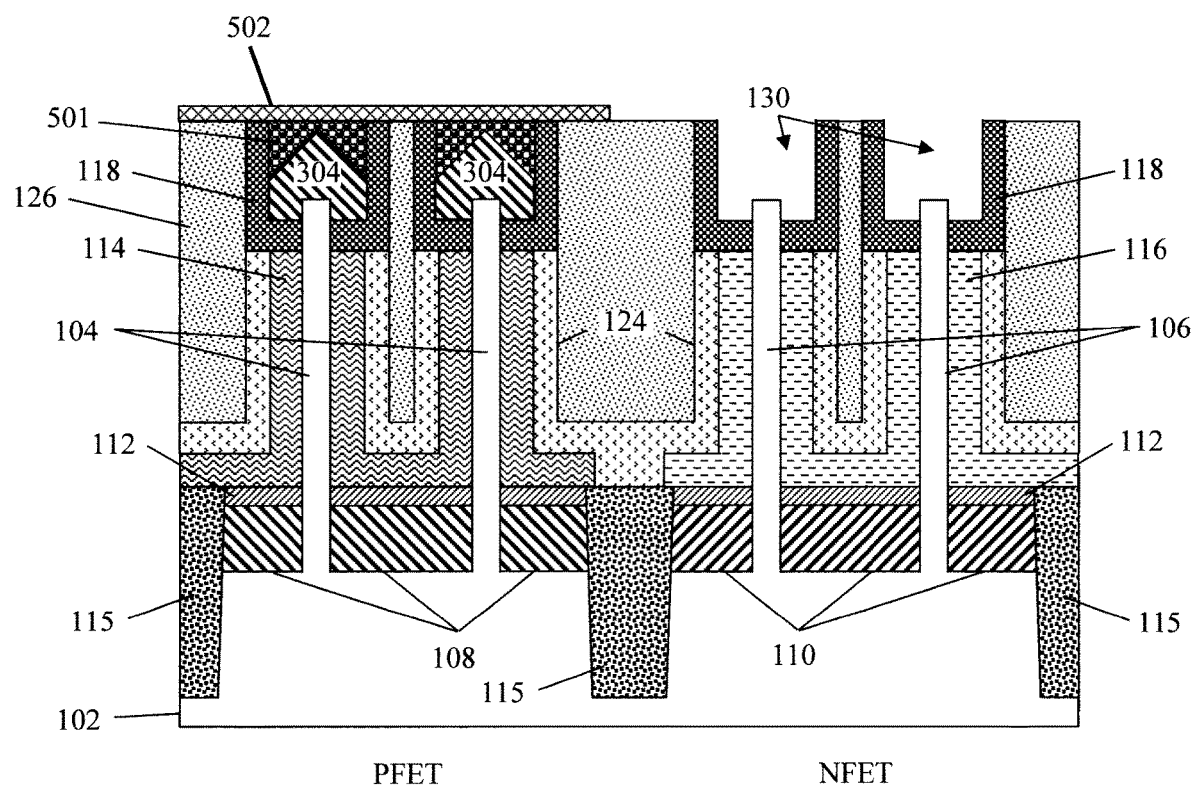
FIG. 5 is a cross-sectional diagram illustrating an etch-back of the first sacrificial capping material having been performed to form (first) sacrificial caps in the first trenches covering the first top source and drains, the first liner having been removed, a (second) liner having been formed over/covering the sacrificial capping material in the first trenches over the first top source and drains/PFET fins, and the sacrificial material having been removed from the second trenches according to an embodiment of the present invention.

An etch-back of the sacrificial capping material 402 is then performed. See FIG. 5. Following the etch-back, the goal is to have sacrificial capping material 402 form (first) sacrificial caps 501 present only in trenches 128 covering the top source and drains 304 as shown in FIG. 5. According to an exemplary embodiment, sacrificial capping material 402 is etched-back using a directional (anisotropic) etching process such as RIE. As shown in FIG. 5, liner 302 is next removed to allow for further processing of the NFET fins 106. According to an exemplary embodiment, an etching process such as CMP is used to remove the liner 302. Doing so provides a flat, planar surface on which a (second) liner 502 is formed over/covering the sacrificial capping material 402 in trenches 128 over the top source and drains 304/PFET fins 104. See FIG. 5.

In the same manner as provided above, liner 502 can be formed by first blanket depositing a liner material over both fins 104 and 106, and then patterning the liner material into the liner 502 shown in FIG. 5 covering the sacrificial capping material 402 in trenches 128 over the top source and drains 304/fins 104. Suitable materials for the liner 502 include, but are not limited to, SiN, SiBCN, SiOCN, and/or SiCN. As provided above, a process such as CVD, ALD or PVD can be employed to deposit the liner 502, and standard lithography and etching processes can be employed to pattern the liner material. According to an exemplary embodiment, liner 502 has a thickness of from about 5 nm to about 10 nm and ranges therebetween.

Figure 6:
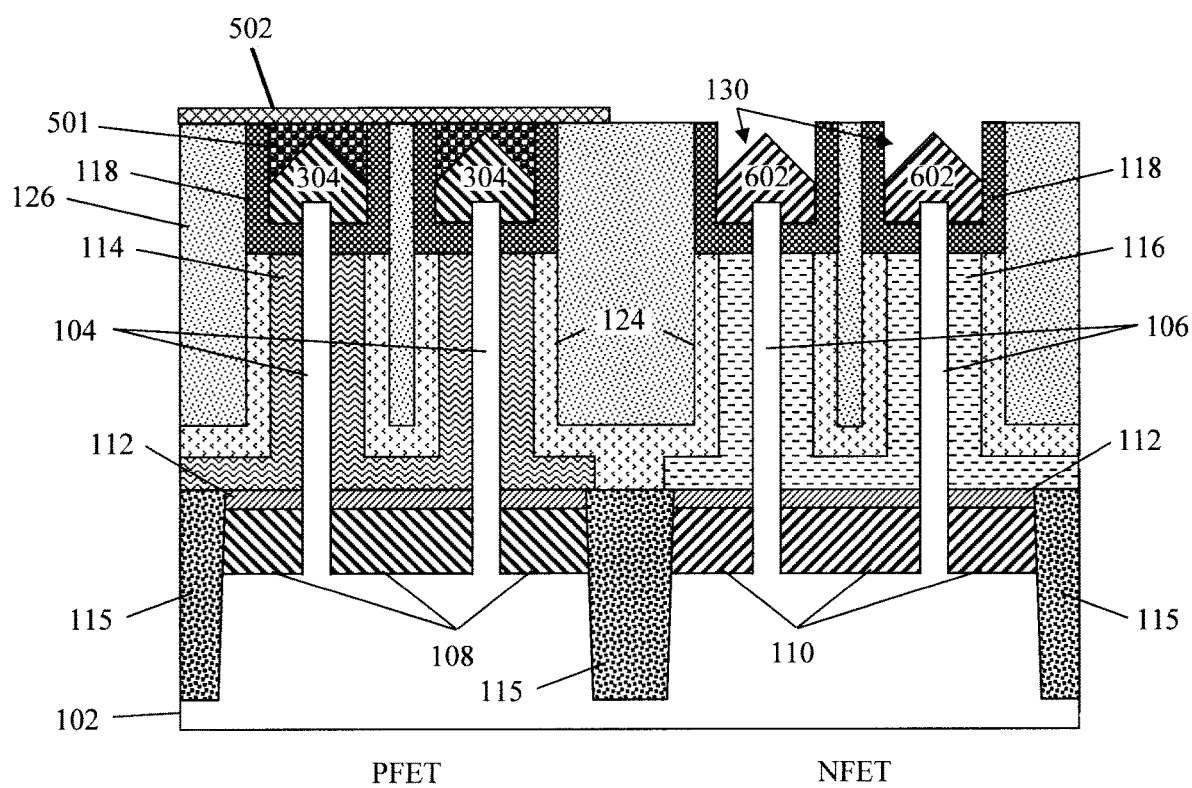
FIG. 6 is a cross-sectional diagram illustrating (second) top source and drains having been formed in the second trenches at the tops of NFET fins according to an embodiment of the present invention.
Figure 7:
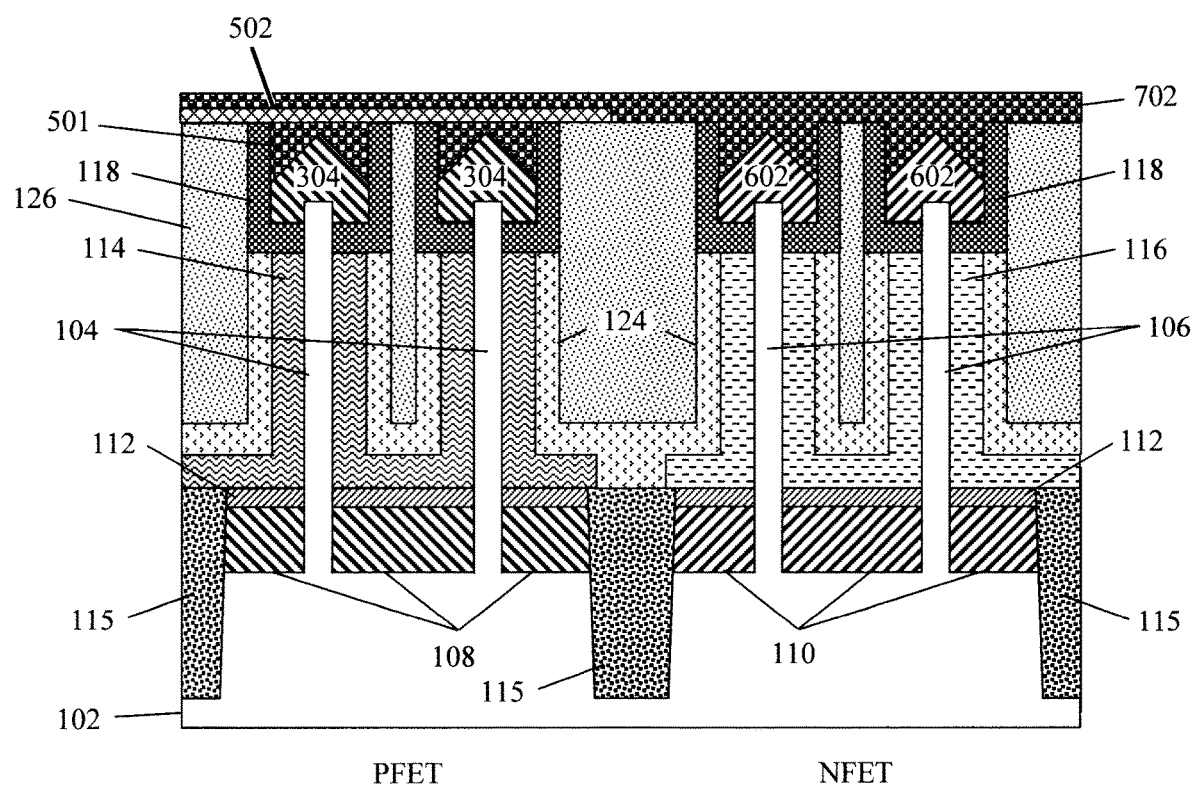
FIG. 7 is a cross-sectional diagram illustrating a (second) sacrificial capping material having been deposited into the second trenches over the second top source and drains and onto the first liner (covering the first sacrificial cap and first top source and drains over the PFET fins) according to an embodiment of the present invention.

As shown in FIG. 5, with liner 502 present over and covering the sacrificial capping material 402 in trenches 128 over the top source and drains 304/fins 104, the sacrificial material 202 is removed from trenches 130. According to an exemplary embodiment, the sacrificial material 202 is removed from trenches 130 using a non-directional (i.e., isotropic) etching process such as a wet chemical etch. Removal of the remaining sacrificial material 202 reopens the trenches 130. As shown in FIG. 6, this enables the formation of (second) top source and drains 602 in trenches 130 at the tops of NFET fins 106, while sacrificial caps 501 and liner 502 mask the top source and drains 304 at the tops of the PFET fins 104.

According to an exemplary embodiment, top source and drains 602 are formed from an n-type in-situ doped (i.e., during growth) or ex-situ doped (e.g., via ion implantation) epitaxial material such as epitaxial Si, epitaxial Ge and/or epitaxial SiGe. As provided above, suitable n-type dopants include, but are not limited to, phosphorous (P) and/or arsenic (As). For instance, by way of example only, in one non-limiting exemplary embodiment, top source and drains 602 are formed from Si:P. As shown in FIG. 6, the top source and drains 602 formed at the at the tops of fins 106 are contained within trenches 130, i.e., the top source and drains 602 formed at the at the tops of fins 106 are non-merged. Further, like top source and drains 304, the top source and drains 602 formed at the at the tops of fins 106 have a diamond-shaped design (i.e., the top surface of top source and drains 602 have downward sloping facets to either side of a central peak. As described above, this diamond-shaped design will advantageously increase the contact area.

In the same manner as above, a (second) sacrificial cap is formed over/covering the top source and drains 602. Namely, a (second) sacrificial capping material 702 is first blanket deposited into trenches 130 over top source and drains 602 and onto liner 502 (covering sacrificial caps 501 and top source and drains 304 over PFET fins 104). See FIG. 7. As provided above, suitable sacrificial capping materials include, but are not limited to, $GeO_2$, $TiO_2$ and/or TiN. A process such as CVD, ALD or PVD can be employed to deposit the sacrificial capping material 702.

Figure 8:
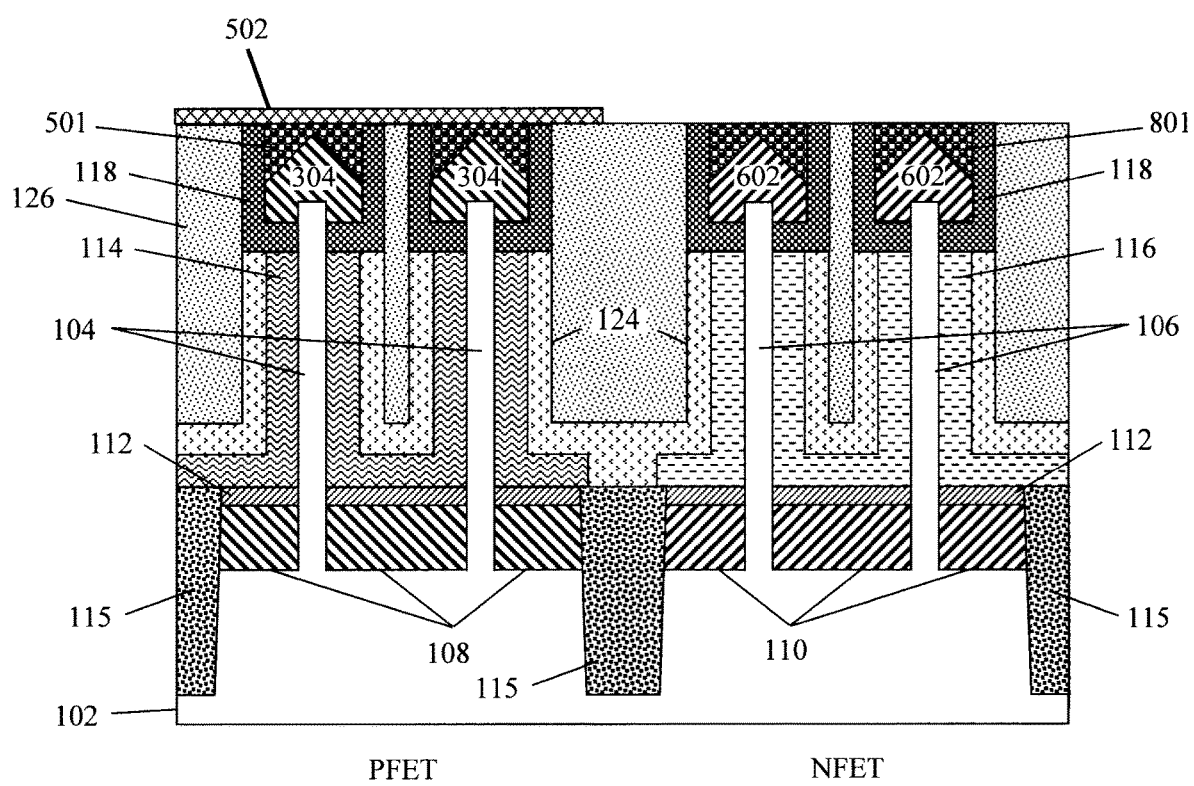
FIG. 8 is a cross-sectional diagram illustrating an etch-back of the second sacrificial capping material having been performed to form (second) sacrificial caps in the second trenches covering the second top source and drains according to an embodiment of the present invention.

An etch-back of the sacrificial capping material 702 is then performed. See FIG. 8. Following the etch-back, the goal is to have sacrificial capping material 702 form (second) sacrificial caps 801 present only in trenches 130 covering the top source and drains 602 as shown in FIG. 8. According to an exemplary embodiment, sacrificial capping material 702 is etched-back using a directional (anisotropic) etching process such as RIE.

Figure 9:
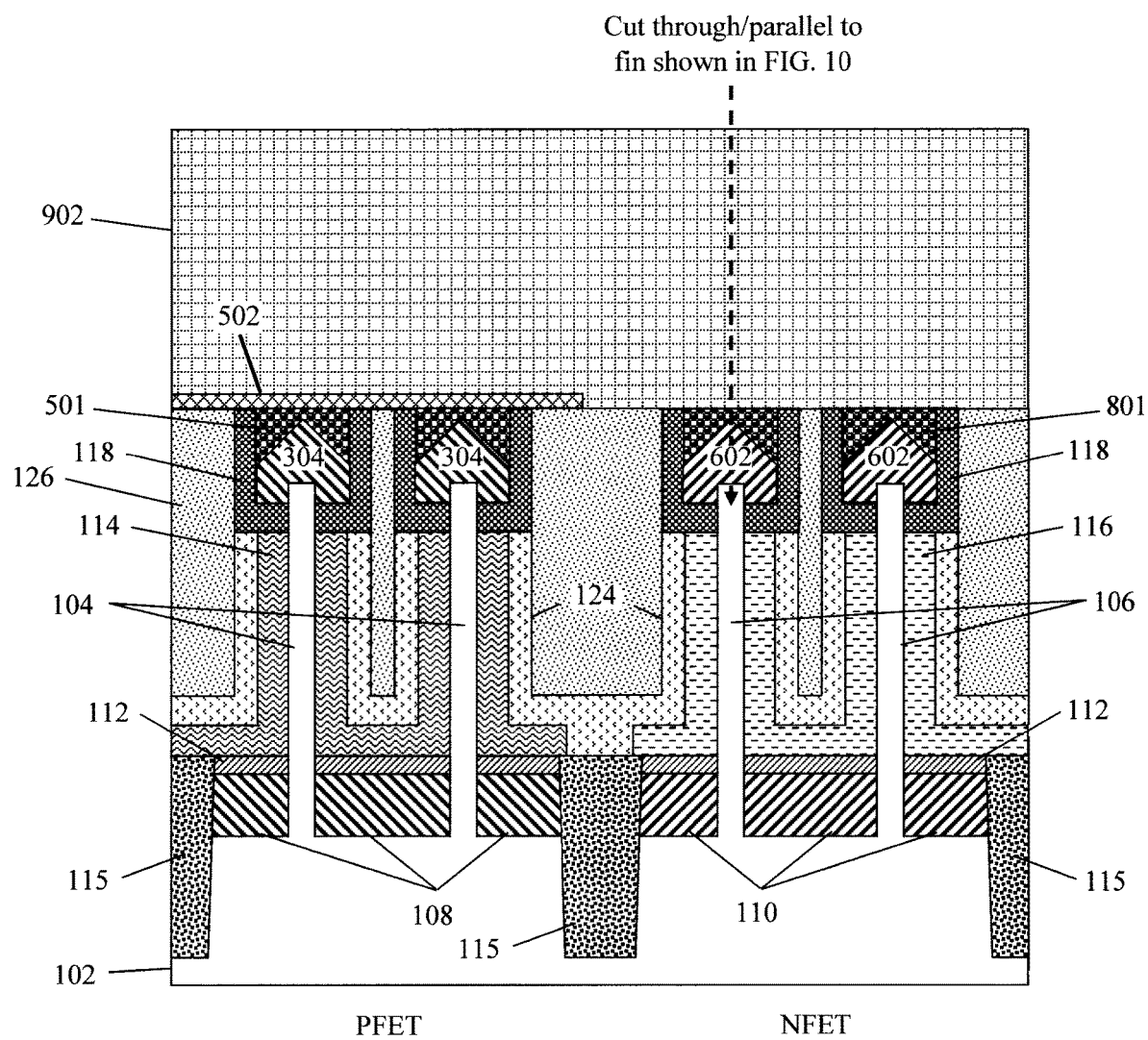
FIG. 9 is a cross-sectional diagram illustrating a (second) ILD having been deposited onto the first ILD over the first/second top source and drains, and first/second sacrificial caps at the tops of the PFET/NFET fins according to an embodiment of the present invention.

A (second) ILD 902 is then deposited onto the ILD 126 over the top source and drains 304 and 602/sacrificial caps 501 and sacrificial caps 801 at the tops of the PFET and NFET fins 104 and 106, respectively. See FIG. 9. Suitable materials for the ILD 902 include, but are not limited to, oxide low-κ materials such as SiOx and/or oxide ULK-ILD materials such as pSiCOH. A process such as CVD, ALD or PVD can be employed to deposit ILD 902. As shown in FIG. 9, liner 502 can remain in place over the top source and drains 304/sacrificial caps 501 at the tops of the PFET fins 104. As such, ILD 902 is now disposed over this liner 502.

Figure 10:
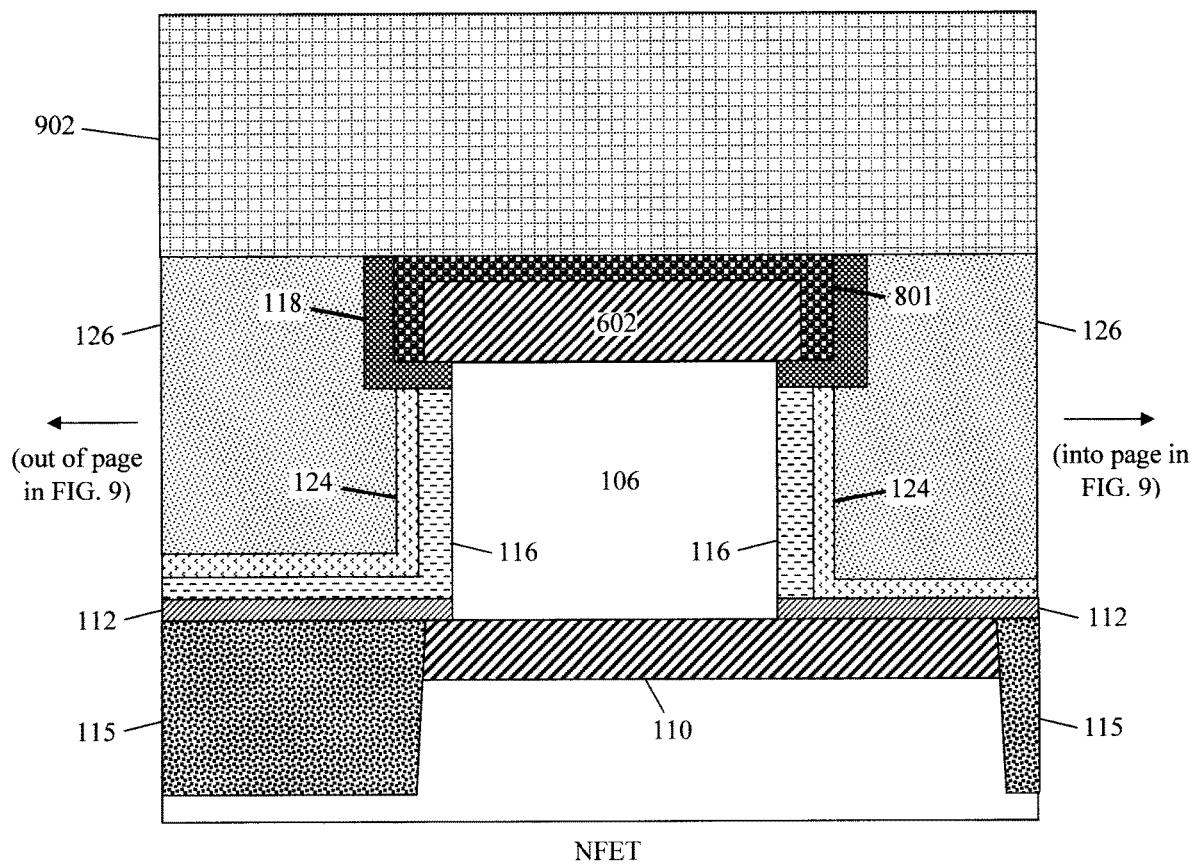
FIG. 10 is a cross-sectional diagram illustrating, from a different cross-sectional view through and parallel to a given one of the NFET fins, that the second sacrificial cap surrounds the top and sides of the second top source and drains over the NFET fins according to an embodiment of the present invention.

FIG. 10 provides a different cross-sectional view through the device structure at this stage of the fabrication process flow. Namely, the figures so far have depicted cross-sectional cuts of the device structure through and perpendicular to the PFET and NFET fins 104 and 106. By contrast, FIG. 10 depicts a cross-sectional cut of the device structure through and parallel to a given one of the NFET fins 106 (see FIG. 9—where the cut parallel to the given NFET fin 106 is into/out of the page). FIG. 10 illustrates how the sacrificial cap 801 surrounds the top and sides of the top source and drains 602 over the NFET fins 106. Although not shown, a cut through and parallel to one of the PFET fins 104 would also show that the sacrificial caps 501 surround the top and sides of the top source and drains 304.

A patterned hardmask 1102 is then formed on ILD 902 marking the footprint and location of top source and drain contacts. See FIG. 11. Suitable hardmask materials include, but are not limited to, nitride hardmask materials such as SiN, silicon oxynitride (SiON), SiCN, and/or oxide hardmask materials such as SiOx. Standard lithography and etching processes can be employed to pattern the hardmask 1102. As will be described in detail below, an etch using hardmask 1102 will be employed to pattern trenches in the ILD 902 (and in liner 502 over the PFET fins 104) to expose the underlying sacrificial caps 501 and 801. The sacrificial caps 501 and 801 are then removed from the top source and drains 304 and 602, respectively, and replaced with the top source and drain contacts.

Figure 11:
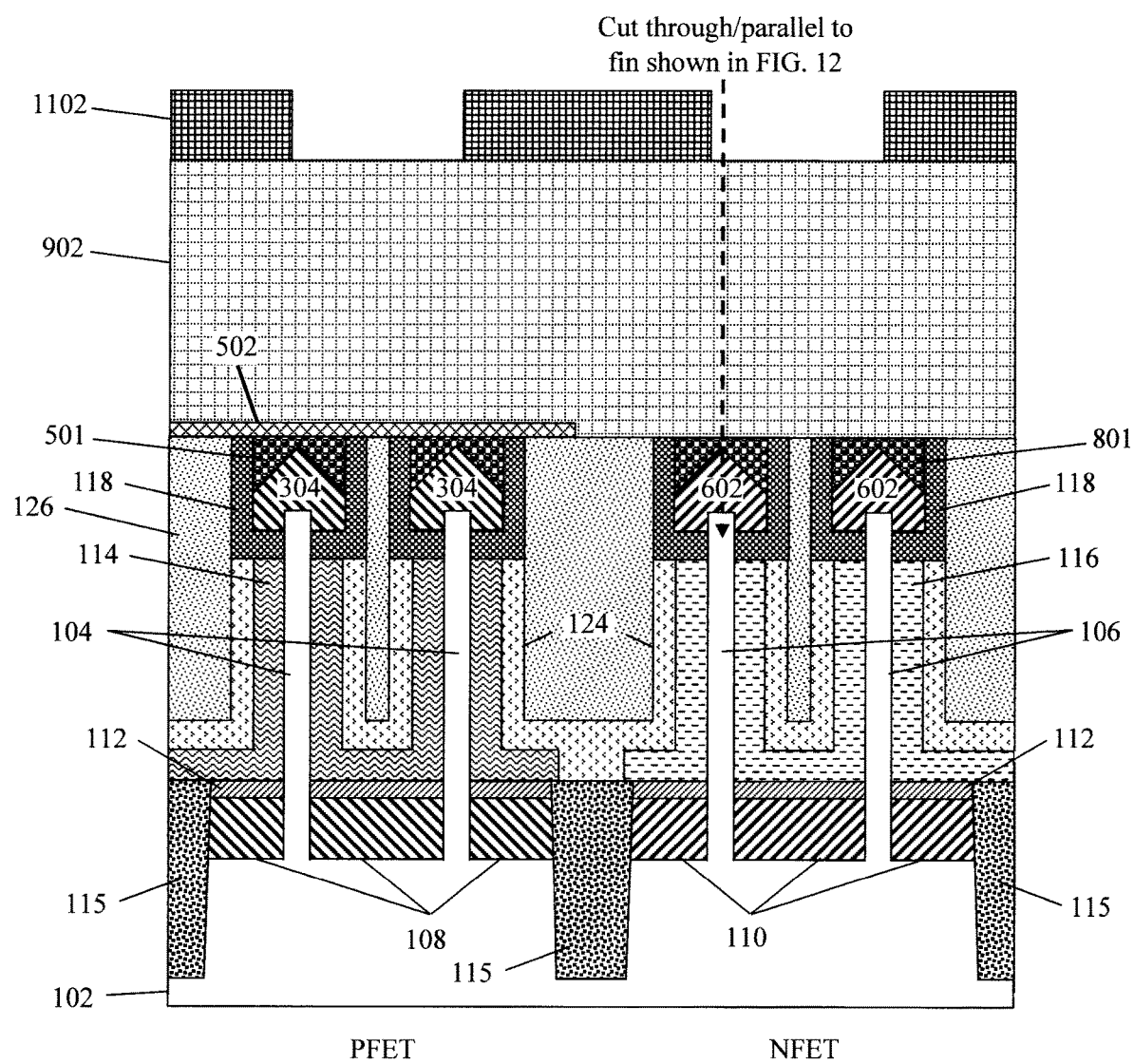
FIG. 11 is a cross-sectional diagram illustrating a patterned hardmask having been formed on the second ILD marking the footprint and location of top source and drain contacts according to an embodiment of the present invention.
Figure 12:
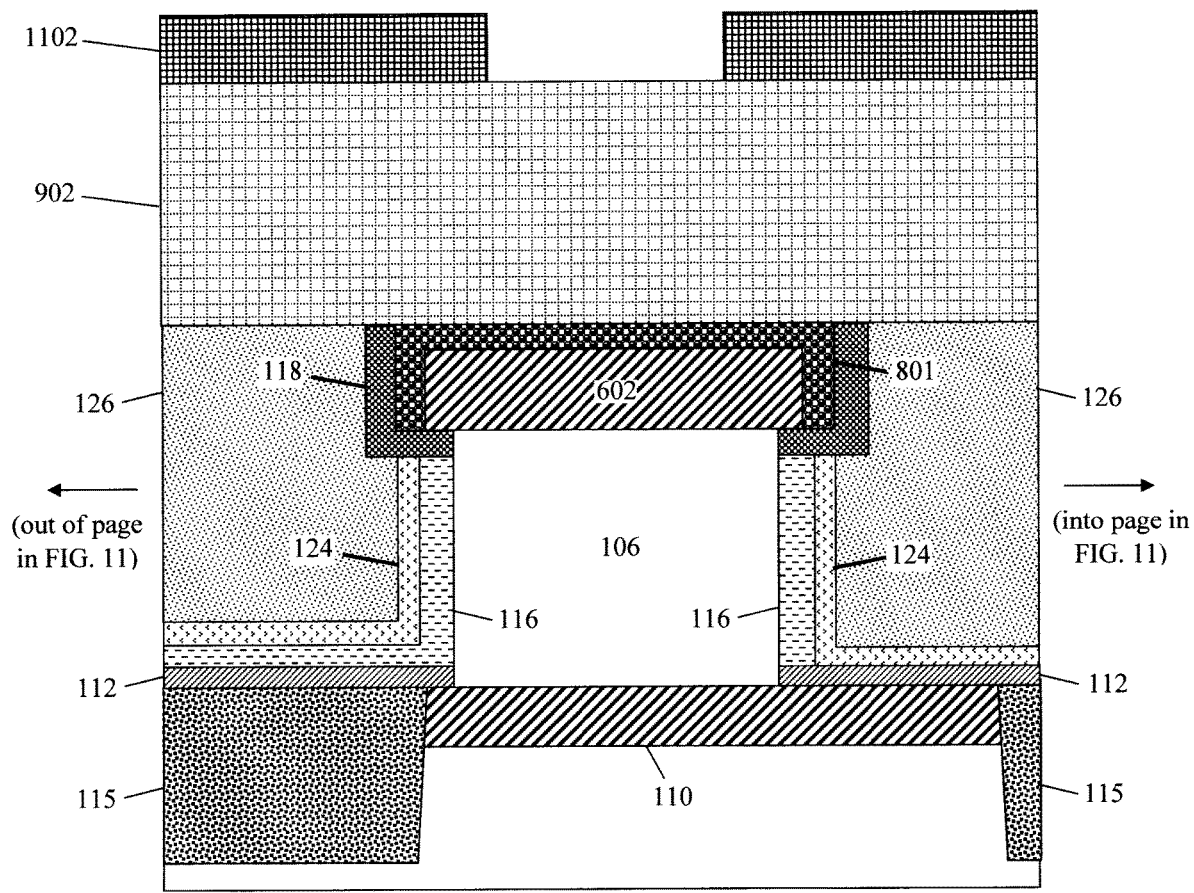
FIG. 12 is a cross-sectional diagram illustrating, from a different cross-sectional view through and parallel to a given one of the NFET fins, the patterned hardmask having been formed on the second ILD marking the footprint and location of the top source and drain contacts according to an embodiment of the present invention.

FIG. 12 provides a different cross-sectional view through the device structure at this stage of the fabrication process flow, i.e., through and parallel to a given one of the NFET fins 106 (see FIG. 11—where the cut parallel to the given NFET fin 106 is into/out of the page). FIG. 12 illustrates patterned hardmask 1102 having been formed on the ILD 902 marking the footprint and location of the top source and drain contacts.

Figure 13:
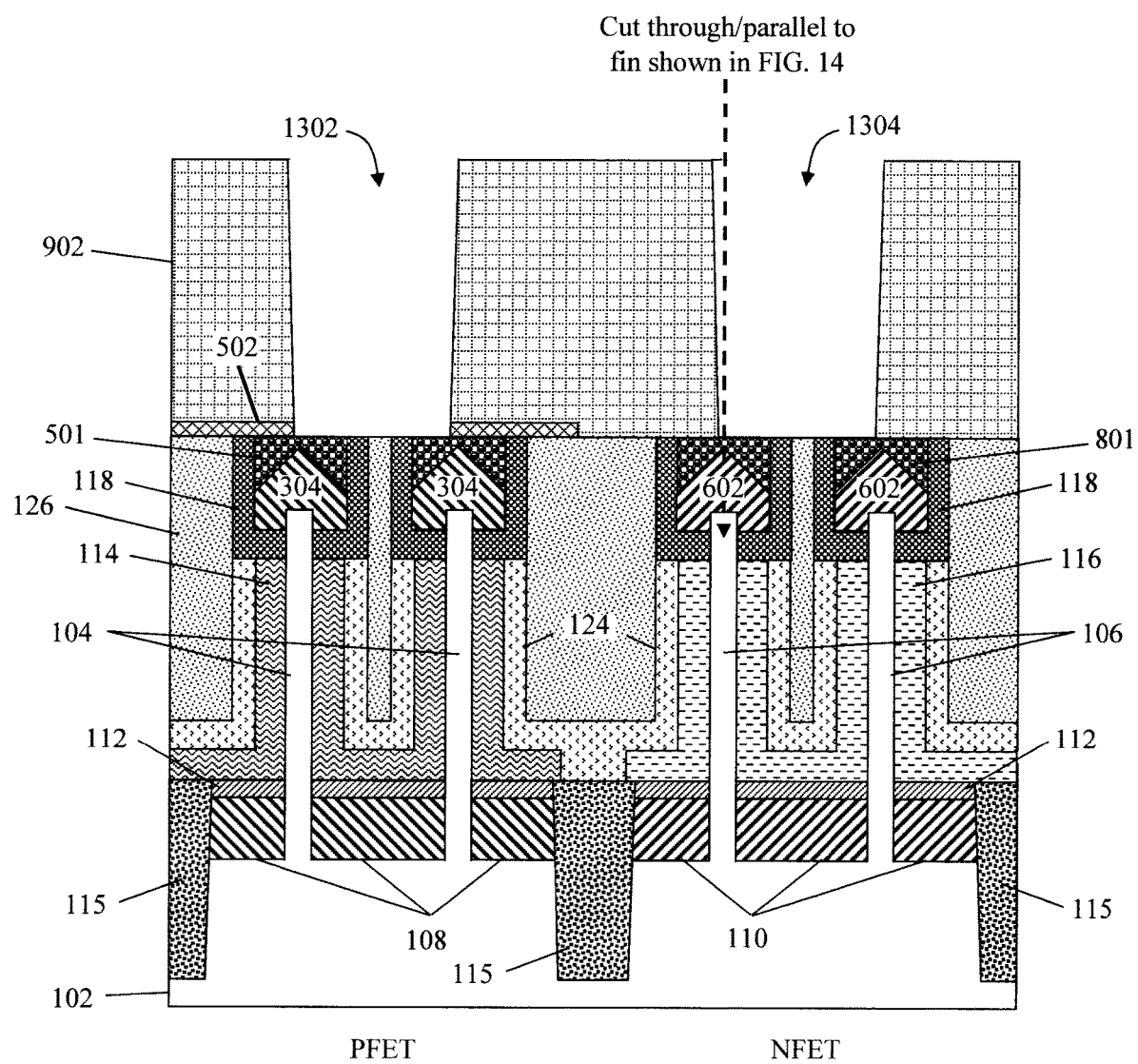
FIG. 13 is a cross-sectional diagram illustrating an etch using the hardmask having been employed to pattern at least one (first) contact trench and at least one (second) contact trench in the second ILD over the first/second top source and drains according to an embodiment of the present invention.

An etch using hardmask 1102 is then employed to pattern at least one (first) contact trench 1302 and at least one (second) contact trench 1304 in the ILD 902 over the top source and drains 304 and 602, respectively. See FIG. 13. According to an exemplary embodiment, a directional (anisotropic) etching process such as RIE is employed for the contact trench etch. As provided above, liner 502 can remain in place over the PFET fins 104. Thus, as shown in FIG. 13, contact trench(es) 1302 extends through the ILD 902 and the liner 502, exposing the underlying sacrificial caps 501 over the top source and drains 304. According to an exemplary embodiment, a single contact trench 1302 is employed to access the top source and drains 304 over multiple PFET fins 104, such as is shown in FIG. 13. However, embodiments are also contemplated herein where multiple contact trenches 1302 are employed to access the top source and drains 304 over multiple groupings of PFET fins 104, or even to access the top source and drains 304 over each of the PFET fins 104 individually.

As shown in FIG. 13, contact trench(es) 1304 extends through the ILD 902, exposing the underlying sacrificial caps 801 over the top source and drains 602. As above, according to an exemplary embodiment, a single contact trench 1304 is employed to access the top source and drains 602 over multiple NFET fins 106, such as is shown in FIG. 13. However, embodiments are also contemplated herein where multiple contact trenches 1304 are employed to access the top source and drains 602 over multiple groupings of NFET fins 106, or even to access the top source and drains 602 over each of the NFET fins 106 individually. Following the patterning of contact trenches 1302 and 1304, the hardmask 1102 is removed.

The sacrificial caps 501 and 801 protect the underlying top source and drains 304 and 602, respectively, during the contact trench etch. Namely, as shown in FIG. 13, the etch of trenches 1302 and 1304 stops on the sacrificial caps 501 and 801 without exposing the underlying top source and drains 304 and 602. Advantageously, having the sacrificial caps 501 and 801 protecting top source and drains 304 and 602 in this manner prevents erosion of the (epitaxial) top source and drains 304 and 602 during the contact trench etch. Later on in the process, a selective etch will be used to remove the sacrificial caps 501 and 801 to enable formation of the top source and drain contacts. However, the impact of this selective etch on the top source and drains 304 and 602 is at most minimal since the sacrificial caps are a different material from the top source and drains 304 and 602.

Figure 14:
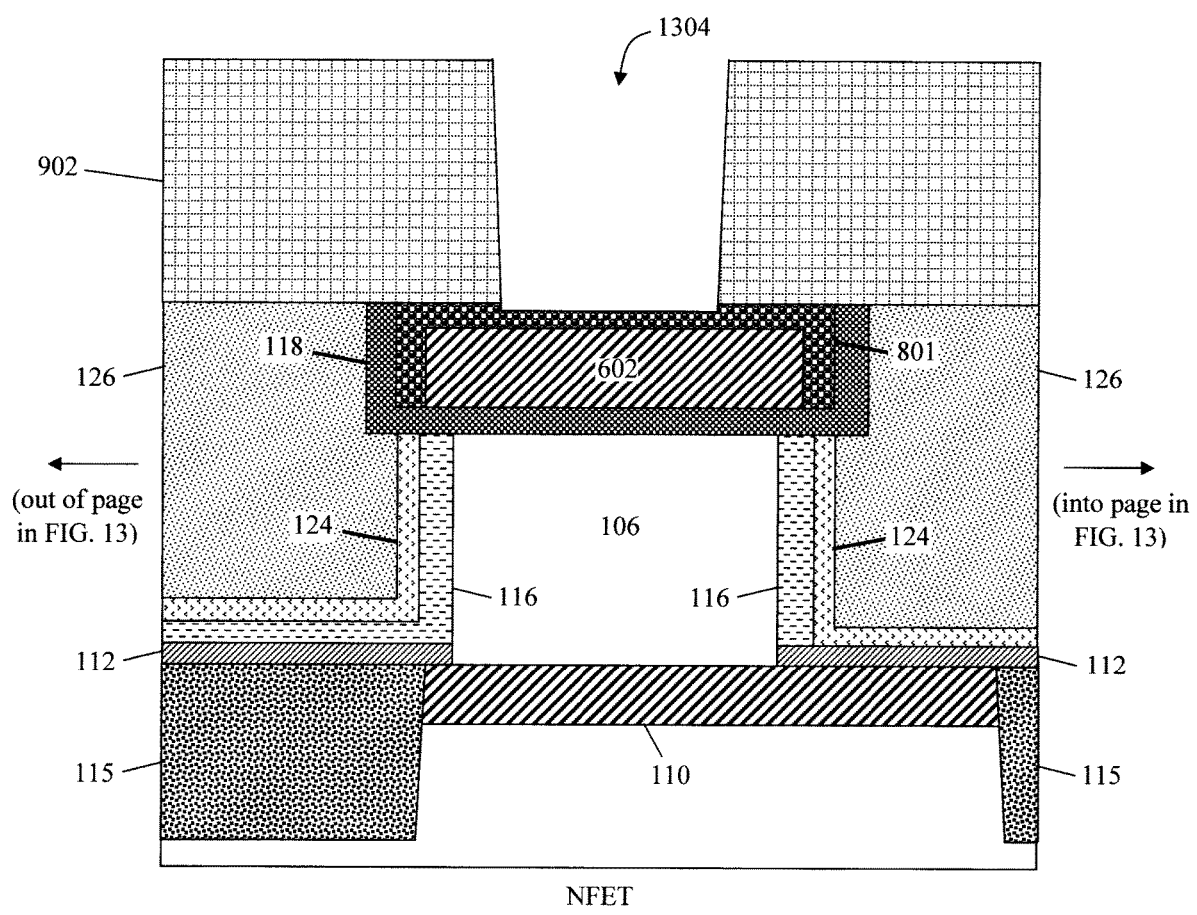
FIG. 14 is a cross-sectional diagram illustrating, from a different cross-sectional view through and parallel to a given one of the NFET fins, the etch using the hardmask having been employed to pattern the second contact trench in the second ILD over the second top source and drains according to an embodiment of the present invention.

FIG. 14 provides a different cross-sectional view through the device structure at this stage of the fabrication process flow, i.e., through and parallel to a given one of the NFET fins 106 (see FIG. 13—where the cut parallel to the given NFET fin 106 is into/out of the page). FIG. 14 illustrates the etch using hardmask 1102 having been performed to pattern trench 1304 in the ILD 902 over the top source and drains 602. Although not shown, a cut through and parallel to one of the PFET fins 104 would show trench 1302 positioned in a similar manner over the top source and drains 304. As shown in FIG. 14, the sacrificial caps 801 protects the underlying top source and drains 602 during the contact trench etch. The same is true for sacrificial cap 501 and top source and drains 304. As provided above, this configuration advantageously prevents erosion of the epitaxial top source and drains 304 and 602 during the contact trench etch.

Figure 15:
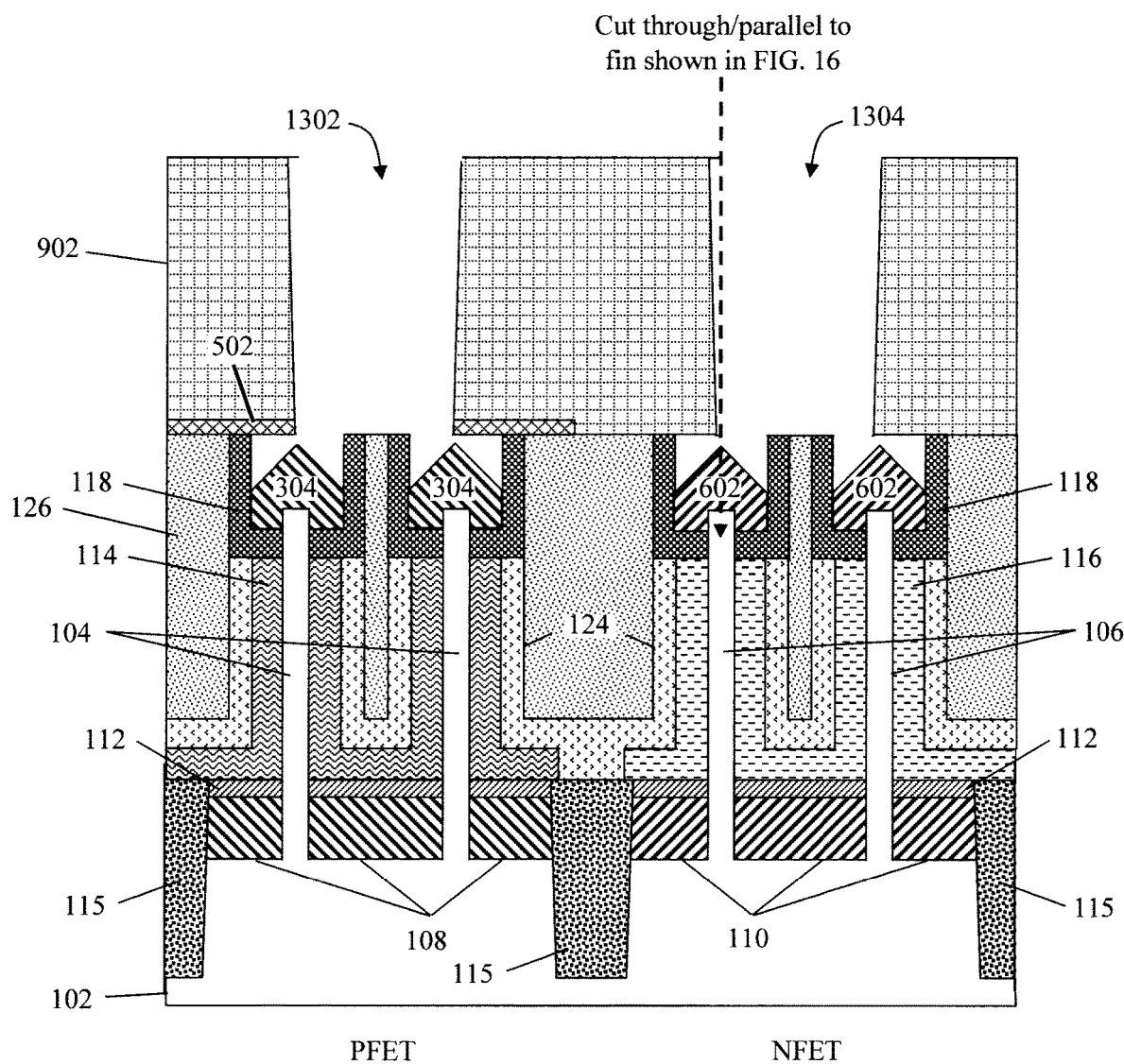
FIG. 15 is a cross-sectional diagram illustrating the first/second sacrificial caps having been removed through the first/second contact trenches according to an embodiment of the present invention.

The sacrificial caps 501 and 801 are then removed through contact trenches 1302 and 1304, respectively. See FIG. 15. As shown in FIG. 15, removal of the sacrificial caps 501 and 801 exposes the underlying top source and drains 304 and 602 at the bottoms of contact trenches 1302 and 1304, respectively. According to an exemplary embodiment, the sacrificial caps 501 and 801 are removed using a non-directional (isotropic) etching process such as a wet chemical etch. For instance, as provided above, sacrificial caps 501 and 801 can be formed from oxide or nitride materials such as $GeO_2$, $TiO_2$ and/or TiN. In that case, an oxide- or nitride-selective wet etch can be employed to remove the sacrificial caps 501 and 801 with minimal, if any, impact on the epitaxial top source and drains 304 and 602. As shown in FIG. 15, by way of the present process the exposed top source and drains 304 and 602 retain their diamond-shaped design (i.e., having downward sloping facets to either side of a central peak). As highlighted above, this diamond-shaped design advantageously increases the contact area. By contrast, if sacrificial caps 501 and 801 had not been used and the peaks of the top source and drains had been eroded during the contact trench etch, then at present the top source and drains would be flatter with a reduced overall contact area.

Figure 16:
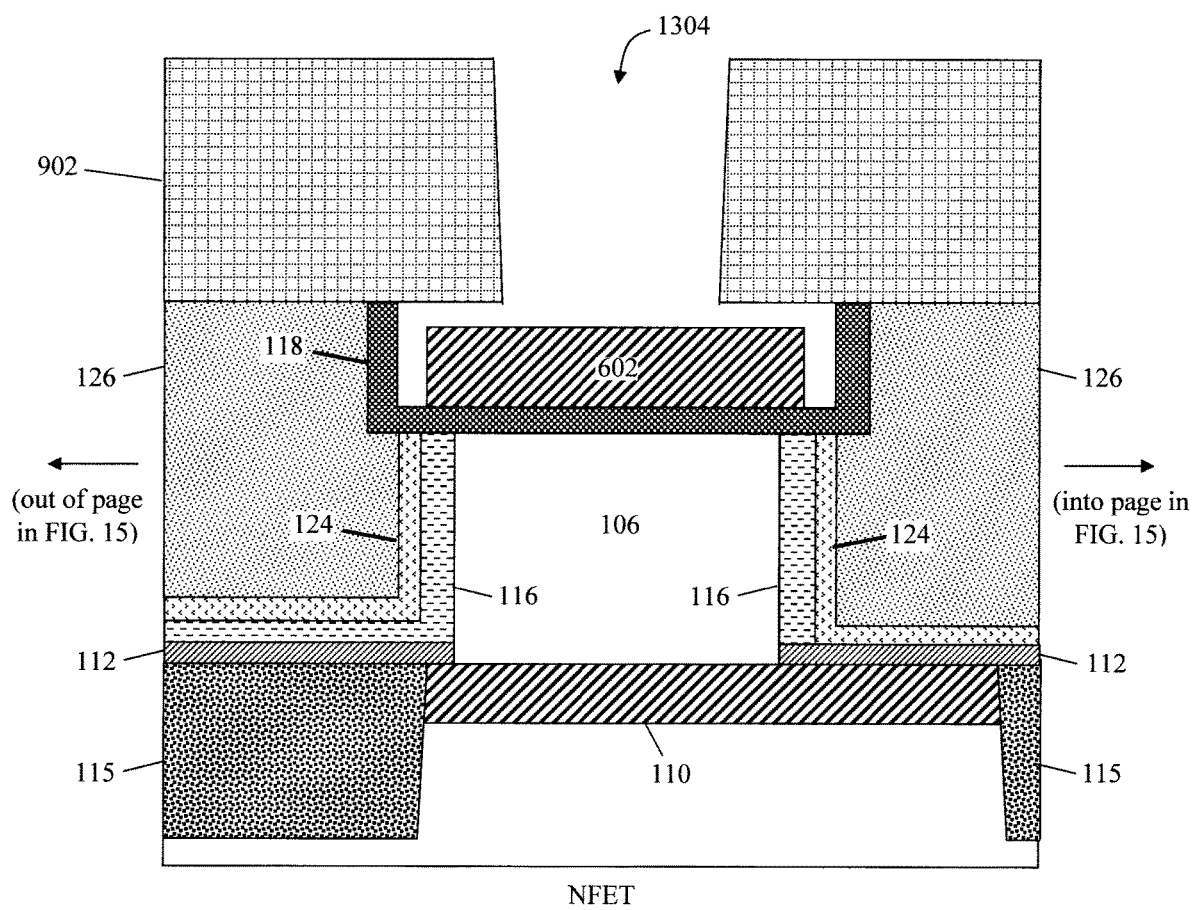
FIG. 16 is a cross-sectional diagram illustrating, from a different cross-sectional view through and parallel to a given one of the NFET fins, the second sacrificial caps having been removed through the second contact trenches according to an embodiment of the present invention.

FIG. 16 provides a different cross-sectional view through the device structure at this stage of the fabrication process flow, i.e., through and parallel to a given one of the NFET fins 106 (see FIG. 15—where the cut parallel to the given NFET fin 106 is into/out of the page). FIG. 16 illustrates the sacrificial caps 801 having been removed through contact trench 1304. Although not shown, a cut through and parallel to one of the PFET fins 104 would show in a similar manner the sacrificial cap 501 having been removed through contact trench 1302. As shown in FIG. 16, the top and side surfaces of the top source and drains 602 are now exposed for contact formation. The same is true for top source and drains 304.

(First/second) top source and drain contacts 1702 and 1704 are then formed in contact trenches 1302 and 1304 surrounding (wrapped around) the top source and drains 304 and 602, respectively. See FIG. 17. According to an exemplary embodiment, top source and drain contacts 1702 and 1704 are formed by filling the contact trenches 1302 and 1304 with a contact metal (or combination of metals). Suitable contact metals include, but are not limited to, copper (Cu), tungsten (W), ruthenium (Ru), cobalt (Co), nickel (Ni) and/or platinum (Pt). The contact metal(s) can be deposited into the contact trenches 1302 and 1304 using a process such as evaporation, sputtering, or electrochemical plating. Following deposition, the metal overburden can be removed using a process such as CMP. Prior to depositing the contact metal(s) into the contact trenches 1302 and 1304, a conformal barrier layer (not shown) can be deposited into and lining the contact trenches 1302 and 1304. Use of such a barrier layer helps to prevent diffusion of the contact metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the contact trenches 1302 and 1304 prior to contact metal deposition. A seed layer facilitates plating of the contact metal into the contact trenches 1302 and 1304.

Figure 17:
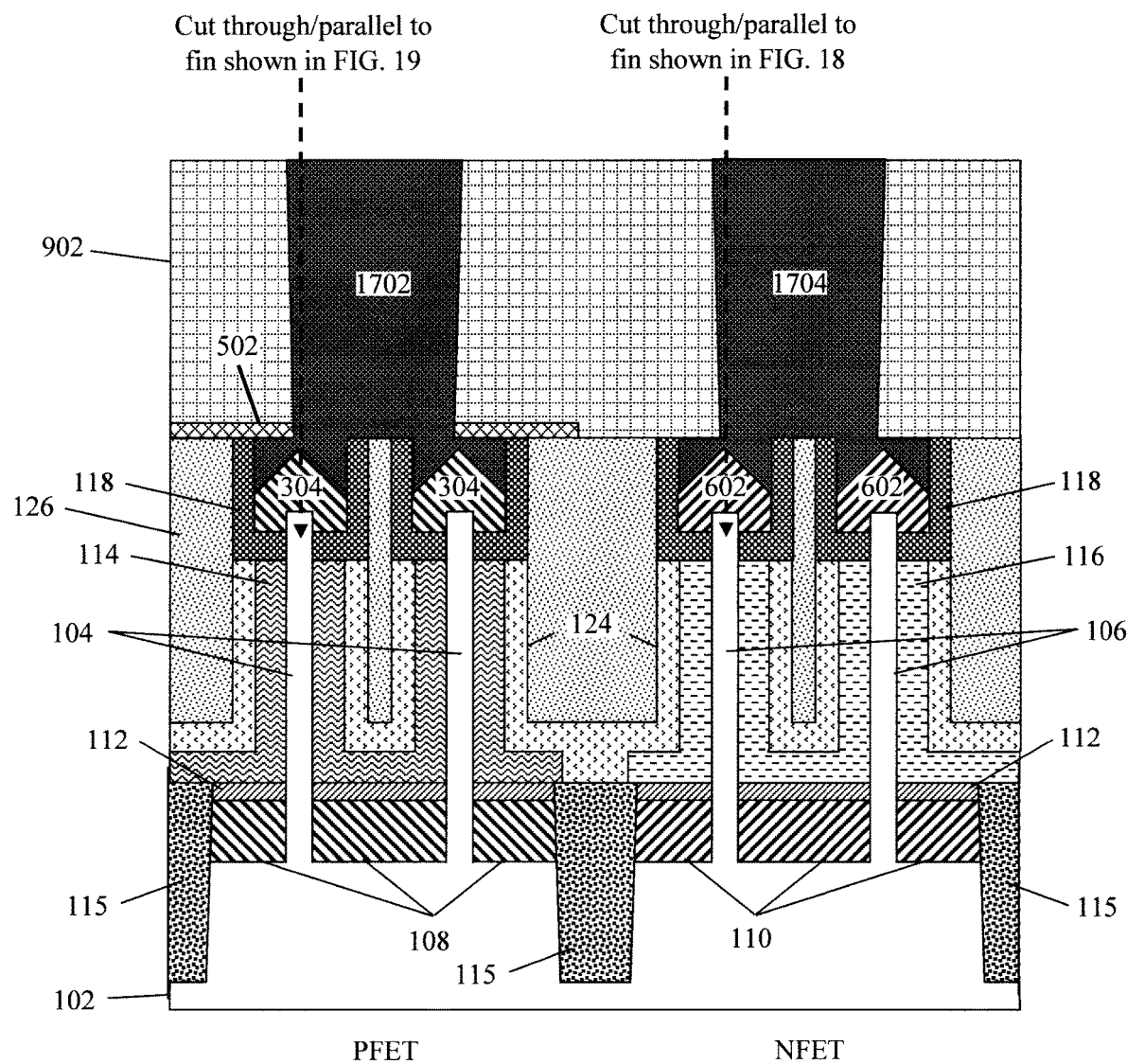
FIG. 17 is a cross-sectional diagram illustrating (first/second) top source and drain contacts having been formed in the first/second contact trenches surrounding (wrapped around) the first/second top source and drains according to an embodiment of the present invention.

As provided above, the top source and drains 304 and 602 are diamond-shaped (i.e., have downward sloping facets to either side of a central peak) which increases contact area. As shown in FIG. 17, top source and drain contacts 1702 and 1704 wrap around these diamond-shaped top source and drains 304 and 602, respectively, further increasing the contact area.

Figure 18:
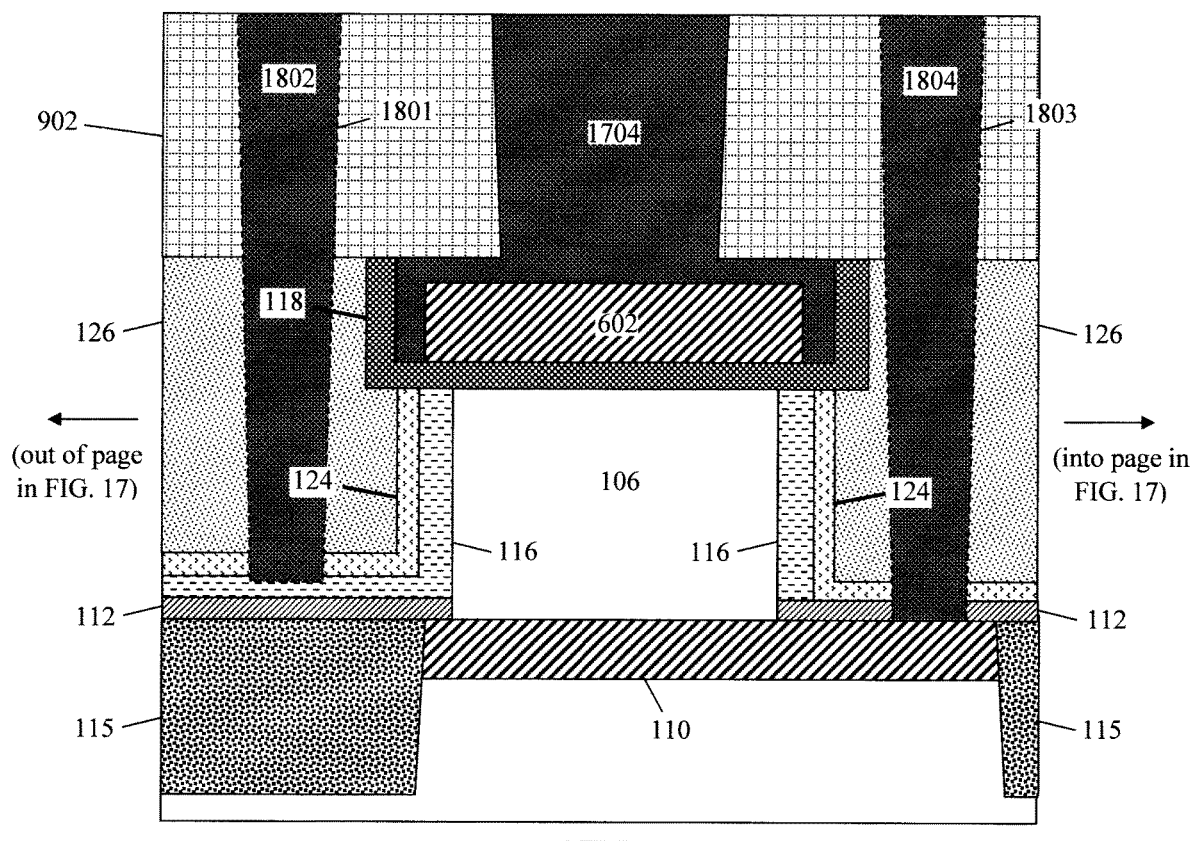
FIG. 18 is a cross-sectional diagram illustrating, from a different cross-sectional view through and parallel to a given one of the NFET fins, the second top source and drain contacts having been formed in the second contact trenches surrounding (wrapped around) the second top source and drains, and a gate contact and a bottom source and drain contact having been formed to the gates alongside the NFET fins and the bottom source and drains at the base of the of the NFET fins according to an embodiment of the present invention.

FIG. 18 provides a different cross-sectional view through the device structure at this stage of the fabrication process flow, i.e., through and parallel to a given one of the NFET fins 106 (see FIG. 17—where the cut parallel to the given NFET fin 106 is into/out of the page). FIG. 18 illustrates the top source and drain contact 1704 having been formed in contact trench 1304 surrounding the top source and drains 602. As shown in FIG. 18, the top source and drain contact 1704 is in contact with the top and side surfaces of the top source and drains 602, i.e., top source and drain contact 1704 wraps around the top source and drains 602. As provided above, the present wrap-around contact design increases the overall contact area.

FIG. 18 further illustrates the formation of a gate contact 1802 and a bottom source and drain contact 1804 to the at least one second workfunction-setting metal 116 (of the NFET gates) and the bottom source and drains 110 of the NFET fins 106, respectively. According to an exemplary embodiment, gate contact 1802 and bottom source and drain contact 1804 are formed by first patterning a trench 1801 (that extends down through the ILD 902, ILD 126 and conformal capping layer 124) and a trench 1803 (that extends down through the ILD 902, ILD 126, conformal capping layer 124 and bottom spacers 112), respectively, the outlines of which are shown using dashed lines. Standard lithography and etching processes can be employed to pattern the trenches 1801 and 1803. According to an exemplary embodiment, a directional (anisotropic) etching process such as RIE is employed for the contact trench etch.

The trenches 1801 and 1803 are then filled with a contact metal (or combination of metals) to form gate contact 1802 and bottom source and drain contact 1804, respectively. As provided above, suitable contact metals include, but are not limited to, Cu, W, Ru, Co, Ni and/or Pt. The contact metal(s) can be deposited into the trenches 1801 and 1803 using a process such as evaporation, sputtering, or electrochemical plating. Following deposition, the metal overburden can be removed using a process such as CMP. Prior to depositing the contact metal(s) into the trenches 1801 and 1803, a conformal barrier layer (not shown) can be deposited into and lining the trenches 1801 and 1803. Use of such a barrier layer helps to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the trenches 1801 and 1803 prior to contact metal deposition. A seed layer facilitates plating of the contact metal into the trenches 1801 and 1803.

Figure 19:
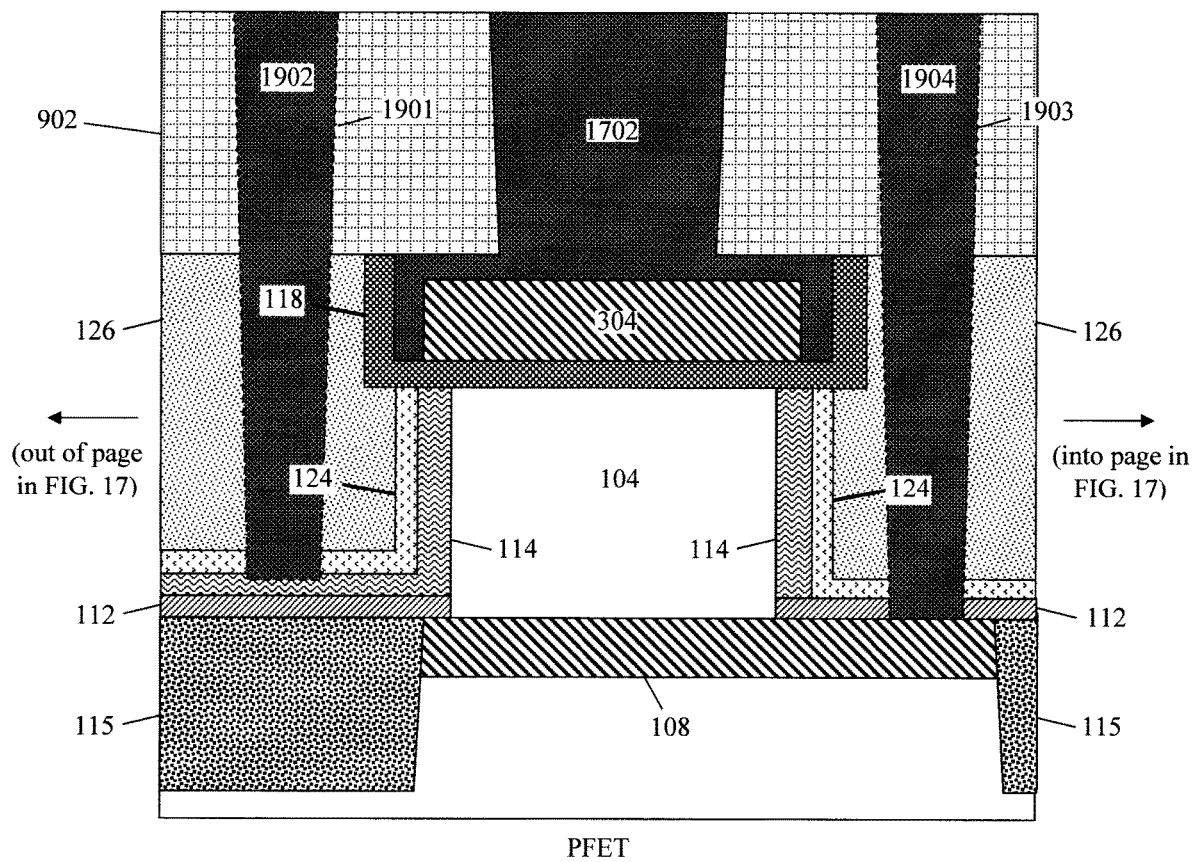
FIG. 19 is a cross-sectional diagram illustrating, from a different cross-sectional view through and parallel to a given one of the PFET fins, the first top source and drain contacts having been formed in the first contact trenches surrounding (wrapped around) the first top source and drains, and a gate contact and a bottom source and drain contact having been formed to the gates alongside the PFET fins and the bottom source and drains at the base of the of the PFET fins according to an embodiment of the present invention.

FIG. 19 provides a different cross-sectional view through the device structure at this stage of the fabrication process flow, i.e., through and parallel to a given one of the PFET fins 104 (see FIG. 17—where the cut parallel to the given PFET fin 104 is into/out of the page). FIG. 19 illustrates the top source and drain contact 1702 having been formed in contact trench 1302 surrounding the top source and drains 304. As shown in FIG. 19, the top source and drain contact 1702 is in contact with the top and side surfaces of the top source and drains 304, i.e., top source and drain contact 1702 wraps around the top source and drains 304. As provided above, the present wrap-around contact design increases the overall contact area.

FIG. 19 further illustrates the formation of a gate contact 1902 and a bottom source and drain contact 1904 to the at least one second workfunction-setting metal 114 and the bottom source and drains 108 of the PFET fins 104, respectively. According to an exemplary embodiment, gate contact 1902 and bottom source and drain contact 1904 are formed by first patterning a trench 1901 (that extends down through the ILD 902, ILD 126 and conformal capping layer 124) and a trench 1903 (that extends down through the ILD 902, ILD 126, conformal capping layer 124 and bottom spacers 112), respectively, the outlines of which are shown using dashed lines. Standard lithography and etching processes can be employed to pattern the trenches 1901 and 1903. According to an exemplary embodiment, a directional (anisotropic) etching process such as RIE is employed for the contact trench etch.

The trenches 1901 and 1903 are then filled with a contact metal (or combination of metals) to form gate contact 1902 and bottom source and drain contact 1904, respectively. As provided above, suitable contact metals include, but are not limited to, Cu, W, Ru, Co, Ni and/or Pt. The contact metal(s) can be deposited into the trenches 1901 and 1903 using a process such as evaporation, sputtering, or electrochemical plating. Following deposition, the metal overburden can be removed using a process such as CMP. Prior to depositing the contact metal(s) into the trenches 1901 and 1903, a conformal barrier layer (not shown) can be deposited into and lining the trenches 1901 and 1903 to help prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the trenches 1901 and 1903 prior to contact metal deposition. A seed layer facilitates plating of the contact metal into the trenches 1901 and 1903.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical transport field-effect transistor (VTFET) device, the method comprising the steps of:
   depositing a first interlayer dielectric (ILD) over a VTFET structure comprising fins patterned in a substrate, bottom source and drains formed at a base of the fins, bottom spacers formed on the bottom source and drains and gates formed alongside the fins above the bottom spacers;
   patterning trenches in the first ILD that expose the tops of the fins;
   forming top spacers conformally lining the trenches;
   forming top source and drains in the trenches at the tops of the fins, wherein the top source and drains are non-merged with one another;
   forming sacrificial caps covering the top source and drains;
   depositing a second ILD onto the first ILD over the top source and drains and the sacrificial caps;
   patterning contact trenches in the second ILD over the top source and drains, exposing the sacrificial caps, wherein the sacrificial caps protect the top source and drains during the patterning of the contact trenches;

removing the sacrificial caps through the contact trenches; and forming top source and drain contacts in the contact trenches that wrap around the top source and drains.

2. The method of claim 1, wherein the sacrificial caps comprise a material selected from the group consisting of: germanium dioxide (GeO$_2$), titanium dioxide (TiO$_2$), titanium nitride (TiN), and combinations thereof.

3. The method of claim 1, wherein the top source and drains each have a diamond-shaped design comprising downward sloping facets to either side of a central peak.

4. The method of claim 1, wherein the top contacts comprise a metal selected from the group consisting of: copper (Cu), tungsten (W), ruthenium (Ru), cobalt (Co), nickel (Ni), platinum (Pt), and combinations thereof.

5. The method of claim 1, wherein the fins comprise first fins and second fins, and wherein the method further comprises the steps of:

masking the trenches over the second fins;

selectively forming the top source and drains in the trenches at the tops of the first fins;

masking the top source and drains in the trenches at the tops of the first fins; and selectively forming the top source and drains in the trenches at the tops of the second fins.

6. The method of claim 5, wherein the first fins comprise p-channel FET (PFET) fins, and wherein the second fins comprise n-channel FET (NFET) fins.

7. The method of claim 5, further comprising the steps of:

depositing a sacrificial material into the trenches;

forming a first liner over the sacrificial material in the trenches at the tops of the second fins;

removing the sacrificial material from the trenches at the tops of the first fins; and selectively forming the top source and drains in the trenches at the tops of the first fins.

8. The method of claim 7, wherein the sacrificial material is selected from the group consisting of: poly-silicon, amorphous silicon, and combinations thereof.

9. The method of claim 7, further comprising the steps of:

forming the sacrificial caps on the top source and drains in the trenches at the tops of the first fins;

forming a second liner over the sacrificial caps on the top source and drains in the trenches at the tops of the first fins;

removing the sacrificial material from the trenches at the tops of the second fins; and selectively forming the top source and drains in the trenches at the tops of the second fins.

10. The method of claim 9, further comprising the step of:

forming the sacrificial caps on the top source and drains in the trenches at the tops of the second fins.

11. The method of claim 9, wherein the first liner and the second liner each comprises a material selected from the group consisting of: silicon nitride (SiN), silicon boron carbon nitride (SiBCN), silicon oxycarbon nitride (SiOCN), silicon carbon nitride (SiCN), and combinations thereof.

12. A method of forming a VTFET device, the method comprising the steps of:

depositing a first ILD over a VTFET structure comprising first fins and second fins patterned in a substrate, bottom source and drains formed at a base of the first fins and the second fins, bottom spacers formed on the bottom source and drains and gates formed alongside the first fins and the second fins above the bottom spacers;

patterning trenches in the first ILD that expose the tops of the first fins and the second fins;

forming top spacers conformally lining the trenches;

masking the trenches over the second fins;

selectively forming first top source and drains in the trenches at the tops of the first fins, wherein the first top source and drains are non-merged with one another;

masking the first top source and drains in the trenches at the tops of the first fins;

selectively forming second top source and drains in the trenches at the tops of the second fins, wherein the second top source and drains are non-merged with one another;

forming sacrificial caps covering the first top source and drains and the second top source and drains;

depositing a second ILD onto the first ILD over the first top source and drains, the second top source and drains and the sacrificial caps;

patterning contact trenches in the second ILD over the first top source and drains and the second top source and drains, exposing the sacrificial caps, wherein the sacrificial caps protect the first top source and drains and the second top source and drains during the patterning of the contact trenches;

removing the sacrificial caps through the contact trenches; and forming top source and drain contacts in the contact trenches that wrap around the first top source and drains and the second top source and drains.

13. The method of claim 12, wherein the first fins comprise PFET fins, and wherein the second fins comprise NFET fins.

14. The method of claim 12, wherein the sacrificial caps comprise a material selected from the group consisting of: GeO$_2$, TiO$_2$, TiN, and combinations thereof.

15. The method of claim 12, wherein the first top source and drains and the second top source and drains each have a diamond-shaped design comprising downward sloping facets to either side of a central peak.

16. The method of claim 12, further comprising the steps of:

depositing a sacrificial material into the trenches;

forming a first liner over the sacrificial material in the trenches at the tops of the second fins;

removing the sacrificial material from the trenches at the tops of the first fins; and selectively forming the first top source and drains in the trenches at the tops of the first fins.

17. The method of claim 16, further comprising the steps of:

forming the sacrificial caps on the first top source and drains in the trenches at the tops of the first fins;

forming a second liner over the sacrificial caps on the first top source and drains in the trenches at the tops of the first fins;

removing the sacrificial material from the trenches at the tops of the second fins; and selectively forming the second top source and drains in the trenches at the tops of the second fins.

18. The method of claim 17, further comprising the step of:
  forming the sacrificial caps on the second top source and drains in the trenches at the tops of the second fins.

\* \* \* \* \*